(12) United States Patent
Kamijo

(10) Patent No.: US 6,501,083 B1
(45) Date of Patent: Dec. 31, 2002

(54) METHODS FOR CALCULATING CUMULATIVE DOSE OF EXPOSURE ENERGY FROM REGIONS OF A MICROLITHOGRAPHY RETICLE FOR USE IN CORRECTING PROXIMITY EFFECTS

(75) Inventor: Koichi Kamijo, Kumagaya (JP)

(73) Assignee: Nikon Corporation, Tokyo (JP)

( * ) Notice: Subject to any disclaimer, the term of this patent is extended or adjusted under 35 U.S.C. 154(b) by 49 days.

(21) Appl. No.: 09/704,473

(22) Filed: Nov. 1, 2000

(30) Foreign Application Priority Data

Nov. 1, 1999 (JP) .......................... 11-310480

(51) Int. Cl.[7] .................. G21K 5/10; H01J 37/08; G06F 17/50; G03C 5/00; G03C 1/725
(52) U.S. Cl. .................. 250/492.22; 250/492.1; 250/492.23; 250/370.07; 716/19; 430/30; 430/22; 430/311
(58) Field of Search .................. 250/492.1, 492.22, 250/492.23, 370.07; 716/19; 430/30, 22, 311, 296

(56) References Cited

U.S. PATENT DOCUMENTS

| | | | | |
|---|---|---|---|---|
| 4,644,170 A | * | 2/1987 | Komatsu ............... 250/398 |
| 5,008,553 A | * | 4/1991 | Abe .................. 250/492.2 |
| 5,051,598 A | * | 9/1991 | Ashton et al. .......... 250/492.1 |
| 5,254,438 A | * | 10/1993 | Owen et al. ............ 430/296 |
| 5,698,859 A | | 12/1997 | Haruki |
| 5,863,682 A | | 1/1999 | Abe et al. |
| 6,035,113 A | * | 3/2000 | Gerber et al. ........... 716/19 |
| 6,226,781 B1 | * | 5/2001 | Nistler et al. .......... 716/19 |

OTHER PUBLICATIONS

Oogi et al., "High–Speed Convolution System for Real–Time Proximity Effect Correction," *Jpn. J. Appl. Phys.* 37:6779–6784 (1998).

\* cited by examiner

*Primary Examiner*—Jack Berman
*Assistant Examiner*—Kalimah Fernandez
(74) *Attorney, Agent, or Firm*—Klarquist Sparkman LLP

(57) ABSTRACT

Methods are disclosed for calculating cumulative exposure energy from a microlithography reticle, especially a reticle used for charged-particle-beam (CPB) microlithography. The methods provide an accuracy of results at least as high as conventional methods, but the subject methods can be performed using substantially less calculation time, even for complex patterns. The pattern features contained within a region and/or one or more size parameters of the region are evaluated according to specified rules. The region also is subdivided according to the specified rules. Subdivision produces subregions that also are evaluated according to the rules to determine whether to subdivide further or to cease further subdivision. The result is a branching structure for the region, containing multiple levels of subregions arranged in an hierarchical manner. As a result, e.g., a subregion distant from a cumulative-energy evaluation point (and that has little effect on the distribution position of elements therein) can be left relatively large, whereas a subregion near the evaluation point has a relatively large effect on the distribution position of the elements therein and hence is relatively small. From the branching structure, cumulative energy is calculated from the constituent subregions.

50 Claims, 20 Drawing Sheets

| 1 (1) | 2 (1) | 5 (0) | 6 (1) | 17 (0) | 18 (0) | 21 (1) | 22 (1) |
|---|---|---|---|---|---|---|---|
| 3 (1) | 4 (1) | 7 (1) | 8 (0) | 19 (1) | 20 (1) | 23 (1) | 24 (1) |
| 9 (0) | 10 (0) | 13 (1) | 14 (0) | 25 (0) | 26 (0) | 29 (1) | 30 (1) |
| 11 (0) | 12 (0) | 15 (1) | 16 (1) | 27 (0) | 28 (1) | 31 (1) | 32 (1) |
| 33 (1) | 34 (1) | 37 (0) | 38 (0) | 49 (0) | 50 (1) | 53 (1) | 54 (0) |
| 35 (1) | 36 (0) | 39 (0) | 40 (0) | 51 (0) | 52 (0) | 55 (1) | 56 (0) |
| 41 (1) | 42 (0) | 45 (1) | 46 (1) | 57 (1) | 58 (0) | 61 (1) | 62 (1) |
| 43 (0) | 44 (0) | 47 (1) | 48 (1) | 59 (1) | 60 (1) | 63 (0) | 64 (1) |

METHODS FOR CALCULATING CUMULATIVE DOSE OF EXPOSURE ENERGY FROM REGIONS OF A MICROLITHOGRAPHY RETICLE FOR USE IN CORRECTING PROXIMITY EFFECTS

FIELD OF THE INVENTION

The present invention pertains to microlithography (projection-transfer of a pattern, defined by a reticle, onto a sensitive substrate) using an energy beam such as a charged particle beam (e.g., electron beam or ion beam). Microlithography in general is a key process used in the manufacture of microelectronic devices such as integrated circuits, displays, and the like. More specifically, the invention pertains to methods for determining proximity effects encountered with certain microlithography techniques, especially charged-particle-beam (CPB) microlithography. The methods involve determinations of cumulative exposure energy (exposure dose) at specific loci on a sensitive substrate. The results of such determinations are used for, inter alia, designing reticles that are less subject to proximity effects during use.

BACKGROUND OF THE INVENTION

All conventional wafer-processing methods include at least one microlithography step, in which a pattern, defined on a mask or reticle, is transferred onto a sensitive substrate such as a semiconductor wafer. Typically, multiple "chips" are formed on each wafer, and multiple microlithography steps are performed to form various patterned layers of the chips. As an energy medium for making the pattern transfer, a beam of electromagnetic radiation (e.g., light, X-rays) or of charged particles (e.g., electron beam, ion beam) is used. To be imprinted with the pattern, the substrate is coated with a suitable "resist." With a "positive" resist, regions that receive a cumulative exposure energy (dose) exceeding a threshold value are removed by developing the resist. With a "negative" resist, regions that receive a cumulative exposure dose exceeding a threshold value are left on the wafer after development. Hence, in order to form a pattern properly on the substrate, it usually is necessary to calculate whether the cumulative exposure dose at each region of the substrate is higher than the specified threshold value. It also is necessary to configure the reticle so that the respective shapes of the regions where energy accumulates above the threshold value will form pattern elements having the intended profiles.

In charged-particle-beam (CPB) microlithography, "proximity effects" frequently are encountered, in which the respective doses of exposure energy received at any of various loci on the wafer surface vary according to the respective distribution and configuration of pattern elements in the vicinity of the loci. I.e., the distribution and configuration of nearby pattern elements affect the manner in which charged particles of the beam are scattered as they encounter the substrate. Scattered charged particles can cause unintentional development of nearby regions of the resist in various ways, resulting in pattern elements being formed on the substrate having profiles that deviate substantially from the intended profiles of the elements. I.e., the profiles of the pattern elements as formed on the wafer unintentionally have different profiles than the corresponding elements as defined on the reticle.

In optical microlithography, proximity effects as summarized above generally do not occur. However, errors in the pattern as transferred to the substrate can occur due to light diffraction. Hence, in both optical and CPB microlithography, unavoidable differences can arise between the shapes of pattern elements as defined on the reticle versus the shapes of corresponding pattern elements as formed on the substrate.

Various methods have been considered for solving this problem. The methods generally involve changing and adjusting localized cumulative amounts of radiation dose received at the substrate so as to obtain the desired distribution of cumulative exposure energy at the surface of the substrate. For example, certain methods involve localized deformation of certain pattern elements as defined on the reticle.

A conventional method for calculating local cumulative exposure dose, leading to corresponding deformations of pattern elements as defined on the reticle to correct proximity effects in CPB microlithography, is discussed below, referring to FIGS. 20(a)–20(c). In FIG. 20(a), item 101 is a pattern element having a profile that is to be transferred to the substrate with minimal profile change. For convenience, the transfer magnification is unity. The edge of the pattern element 101 is divided into N segments $S_1$–$S_N$ as shown in FIG. 20(b). The element as defined on the reticle is deformed deliberately by moving each of these segments a tiny amount in a direction perpendicular to the direction in which the edge of the segment extends. This is shown in FIG. 20(c), which depicts a magnified view of a portion of the pattern element 101 after moving certain segments. Specifically, FIG. 20(c) shows segments $S_1$, $S_2$, and $S_N$. The desired outline of the pattern element to be formed on the substrate is denoted by the line 102. In FIG. 20(c), segments $S_N$ and $S_2$ have been moved inward relative to the line 102 (thereby forming "indents"), and the segment $S_1$ is moved outward (thereby forming a "projection"). $A_1$, $A_2$, $A_N$ denote respective points on the line 102 corresponding to centers of the respective edges of "pre-move" segments $S_1$, $S_2$, $S_N$. The points $A_1$, $A_2$, $A_N$ are points at which evaluations of cumulative exposure dose are made.

Referring further to FIG. 20(c), $D_1$, $D_2$, and $D_N$ are respective vectors indicating the magnitude and direction of movement of the edge of each respective segment $S_1$, $S_2$, $S_N$. A respective vector $D_1$–$D_N$ is assumed for each segment $S_1$–$S_N$ in this manner, and the change in cumulative exposure dose occurring at each evaluation point $A_1$–$A_N$ is calculated in accordance with the change in position of the edge of each segment according to the respective vector. That is, cumulative exposure energy (dose) is changed at each evaluation point $A_i$ (i=1, 2, ..., N) by moving the edge of the respective segment $S_1$–$S_N$ according to the respective vector $D_j$ (j=1, 2, ..., N), and the change in cumulative exposure dose received at each evaluation point $A_i$ (i=1, 2, ..., N) can be determined from the respective vector.

Before actually moving each segment $S_1$–$S_N$, the cumulative exposure dose that would be received by the entire respective pattern element (e.g. as shown in FIG. 20(a)) after moving the segments is determined. Desirably, the total exposure dose received by the element after moving the segments is unchanged from the total exposure dose that otherwise would be received by the pattern element before moving the segments. Hence, for each element, the vectors $D_j$ (j=1, 2, ..., N) are re-determined in an iterative manner as required until the total exposure dose received by all the evaluation points $A_i$ (i=1, 2, ..., N) of the element is equal to the total that otherwise would be obtained if the respective pattern element were unchanged from that shown in FIG. 20(a).

In the method summarized above, the evaluation points $A_i$ (i=1, 2, ..., N) are positioned on the sensitive substrate to correspond to the center points of each "pre-move" segment $S_1$–$S_N$. Alternatively, the distribution of cumulative exposure dose may be evaluated along respective lines intersecting each segment at an angle, as described in U.S. Pat. No. 5,698,859, incorporated herein by reference. For example, the distribution of cumulative exposure dose can be evaluated along a line 103 perpendicularly intersecting segment S2 (FIG. 20(c)).

FIGS. 21(a)–21(b) show a second conventional method for calculating cumulative exposure dose, termed a "representative figure" method. This method achieves simplification of pattern-element figures by reducing the number of pattern-element figures referred to for calculating cumulative exposure energy (dose). I.e., the complex and fine pattern-element figures of, e.g., an LSI pattern are replaced (for analysis purposes) with simple figures each having "coarse" pattern information that is the same as that of the original pattern-element figures in individual small regions of the pattern. For ease of discussion, the magnification of the image as formed on the substrate, relative to the pattern as formed on the reticle, is unity. In FIG. 21(a) "P" is a point at which cumulative exposure dose is calculated, "F" is a pattern element, and "101" denotes a reference region referred to for calculating the cumulative exposure dose. Only the pattern elements in the region 101 are assumed to have any effect on the cumulative exposure dose at the point P. The region 101 is divided into small regions 102 of a suitable size. (In this example, the region 101 is divided vertically and horizontally three times each, for a total of nine small regions 102. In actual practice each region 101 is divided into many more small regions 102 than nine.)

The total pattern-element area and centroid of the respective pattern element(s) in each small region 102 are calculated for each small region 102. Then, as shown in FIG. 21(b), a respective simplified figure F' (known as a "representative figure") is created for each small region 102. Note that each small region 102 has a single representative figure. Each simplified figure F' has the same total pattern-element area and centroid as determined for the actual pattern element(s) in the respective small region 102 that may or may not contain pattern elements.

When calculating the cumulative exposure dose for each small region 102, the calculation is performed for each representative figure F' instead of having to calculate the dose for each pattern element F in the small region 102 and summing them for each small region 102. To form the small regions 102, the reference region 101 simply is divided equally, horizontally and vertically, into equal-area small regions 102.

The disadvantage with the first conventional method summarized above is that, with N divided segments, calculations must be performed $N^2$ times. Hence, as N increases, the number of calculations increases geometrically, and calculation time correspondingly increases.

With the second conventional method summarized above, as the size of the small regions 102 increases, each small region encompasses more respective pattern elements that are replaced, for analysis purposes, by a respective representative figure, and calculation speed increases. However, simply increasing the size of the small regions does not take into account data concerning the distribution of pattern elements inside each small region 102. Consequently, the accuracy of the determined value of cumulative exposure dose received by each small region is less than obtainable if the representative figure method were not used. Conversely, if the size of the small regions 102 were to be decreased, then the accuracy of the exposure-dose calculations would increase, but there would be little to no difference between the number of original pattern elements and the number of representative figures. Hence, the benefit of improving calculation speed is lost.

SUMMARY OF THE INVENTION

In view of the shortcomings of the prior art as summarized above, an object of the invention is to provide improved methods for calculating cumulative exposure dose (energy) of defined regions of a reticle pattern. The methods provide a calculation accuracy at least as good as conventional methods but can be performed faster so as to accommodate the increasing number and complexity of pattern elements in contemporary microelectronic-device patterns. Other objects are to provide proximity-effect calculation methods utilizing such methods, reticle-design methods including such proximity-effect calculation methods, and microelectronic-device-fabrication methods utilizing reticles manufactured using such reticle-design methods.

A first aspect of the invention is directed to methods for determining a cumulative dose of exposure energy received by exposed portions of the sensitive substrate, as used in a microlithography method in which a pattern defined on a reticle is transferred to a sensitive substrate using an energy beam. According to one embodiment of such a method, in a first-level region of the reticle defining multiple pattern elements with respect to which cumulative exposure dose is to be determined, the total cumulative dose for the region is set initially to zero. Also, an evaluation point is selected in the region at which cumulative exposure dose is to be calculated. The region is divided in a branching manner into a second level of subregions each having a respective reference point from which distance measurements concerning the subregion are to be taken.

If a subregion has a size parameter that, in a ratio to a distance between the respective reference point and the evaluation point, is greater than a specified value $\phi$, then the following sub-steps are performed: (1) the subregion is not subdivided, (2) the pattern elements located in the subregion are converted into at least one corresponding representative figure, (3) based on the representative figure(s) in the subregion, a contribution of the subregion to the cumulative dose of exposure energy at the evaluation point is calculated, and (4) the contribution is added to the total cumulative dose for the evaluation point in the region. If a subregion contains a number of pattern elements that is no greater than a specified number m, then the following sub-steps are performed: (1) the subregion is not subdivided, (2) the pattern element(s) in the subregion are regarded as their own respective representative figure(s), (3) based on the representative figure(s) in the subregion, a contribution of the subregion to the cumulative dose of exposure energy at the evaluation point is calculated, and (4) the contribution is added to the total cumulative dose for the evaluation point in the region. The two conditional steps noted above in this paragraph can be performed in either order. If a subregion does not satisfy either of these conditional steps, then the subregion is subdivided in a branching manner into a next-lower (e.g., third) level of subregions, wherein each next-lower-level subregion has a respective reference point from which distance measurements concerning the subregion are to be taken. Then, the steps described in this paragraph are repeated for each of the next-lower-level subregions. After exhaustively subdividing the region as summarized above, the resulting cumulative exposure dose is regarded as the cumulative exposure dose for the evaluation point in the region.

This embodiment differs from the conventional "representative figure" method, in which the subject region is divided into identically sized subregions regardless of any specific characteristics of the region or of the distribution of pattern elements in the region. In this embodiment, in contrast, a subregion located distantly from the evaluation point has relatively little effect on the distribution of the pattern portion in the region. Hence, the more distant subregion can be larger than subregions nearer to the evaluation point. In contrast, a subregion located near the evaluation point has a relatively large effect on the distribution of the pattern portion in the region. Hence, the nearer subregion typically is relatively small. These differently sized subregions result from application of branching division according to the invention.

In other words, a region to be evaluated is subdivided according to specified rules. In applying the rules, decisions are made on whether to further subdivide a subregion. If the decision is to subdivide, then the subdivision is conducted according to the specified rules to produce subregions at the next lower level. In this manner, the region is divided into a respective group of subregions that are hierarchically related to each other according to the branching structure that was created.

In this embodiment, the decision criterion for whether to subdivide a region (or subregion) is the ratio of a size parameter of the region (or subregion) to the distance between the evaluation point and a "reference point" for the region (or subregion). The "evaluation point" is a selected point in the region where the cumulative dose of exposure energy in the region is to be calculated. The "reference point" for the region or subregion can be, e.g., the center of the respective region or subregion. Representative size parameters include: (a) the area of the region or subregion, (b) the length of a side of the region or subregion (especially if the region or subregion is a regular polygon such as a square, etc.), and (c) the circumference of the region or subregion. An alternative distance parameter is the maximum distance between the evaluation point and the subject subregion.

If a subregion has a size parameter that, in a ratio to the distance between the respective reference point and the evaluation point, is smaller than the specified value $\phi$, and if the number of pattern elements contained in the subject subregion is no greater than m, then the respective pattern element(s) is regarded as the corresponding representative figure. The contribution of the subject subregion to the cumulative exposure energy for the evaluation point in the region is calculated using the representative figure. The contribution is added to the cumulative exposure energy, and no further subdivision of the subregion occurs. If the number of pattern elements contained in the subject subregion is larger than m, then the subregion is further subdivided in a branching manner into the next-lower-level of constituent subregions.

The simplest value of the number "m" is unity (1), which is useful for any pattern arrangement or size. A value of m=1 also is desired from the perspective of ensuring calculation accuracy.

The simplest manner of converting the pattern portion contained within a subject subregion into one or more representative figures is to convert the portion into a single representative figure. An exemplary method of making such a conversion is described in Oogi et al., "High-speed Convolution System for Real-time time Proximity Effect Correction," *Jap. J. Appl Phys.* 37:6779–6784 (1998). If a subregion contains multiple pattern elements, then the subregion can be subdivided further into lower-level subregions each containing no more than one pattern element. The individual pattern elements in the lower-level subregions can be converted into respective representative figures.

In making the decision on whether to subdivide a region or subregion, a similar result is obtained regardless of which is performed first: (1) determining whether the size parameter of the region or subregion, in a ratio to a distance between the respective reference point and the selected evaluation point, is greater than a specified value $\phi$, or (2) determining whether the number of pattern elements contained in the subject region or subregion is no greater than a less than or equal to a specified number m.

In this embodiment, the steps of subdividing a subject region or subregion and determining cumulative exposure dose are performed simultaneously. Hence, at the time that a region is subdivided exhaustively and converted as required to corresponding representative figures according to the invention, calculation of the cumulative dose of exposure energy also is completed. Conventionally, calculating a contribution to exposure dose made by a representative figure is performed using a "representative figure" method as described in, for example, U.S. Pat. No. 5,863,682, incorporated herein by reference.

In another embodiment of a method according to the invention, in a first-level region of the reticle defining multiple pattern elements with respect to which cumulative exposure dose is to be determined, a total cumulative dose for a selected evaluation point in the region is initialized to zero. The region is divided in a branching manner into one or more sublevels of subregions as required until each of the subregions thus formed contains a respective number of pattern elements no greater than a specified number m. Such branching division creates a branching structure of subregions from the first level to an nh level, wherein each subregion has a respective reference point from which distance measurements concerning the respective subregion are to be taken.

If a subregion in an $i^{th}$ ($1 \leq i \leq n$) level has a size parameter that, in a ratio to a distance between the respective reference point and the evaluation point, is greater than a specified value $\phi$, then the following sub-steps are performed: (1) pattern elements located in the subject subregion are converted into at least one corresponding representative figure, (2) based on the representative figure(s) in the subject subregion, a contribution of the subject subregion to the cumulative exposure dose is calculated, and (3) without regard to any contributions possibly made by $(i+1)^{th}$ or other lower-level subregions of the subject subregion, the contribution of the subject subregion is added to the total cumulative dose for the region. If the subregion in the $i^{th}$ level contains a number of pattern elements that is no greater than a specified number m, then the following sub-steps are performed: (1) the pattern element(s) in the subject subregion is regarded as its own respective representative figure(s), (2) based on the representative figure(s) in the subject subregion, a contribution of the subject subregion to the cumulative exposure dose is calculated, and (3) the contribution of the subject subregion is added to the cumulative dose for the evaluation point in the region. The two conditional steps noted above in this paragraph can be performed in either order. If a subregion does not satisfy either of these conditional steps, then the conditional steps are repeated for $(i+1)^{th}$-level subregions of the subject subregion.

After performing the above for all applicable subregions of the region, then the resulting cumulative exposure dose is regarded as the cumulative exposure dose for the evaluation point in the region.

In the first embodiment summarized above, subdivision of a region and calculation of cumulative exposure energy were performed simultaneously, subregion-by-subregion as the subregions were designated. In the second embodiment, in contrast, complete branching division of a region is performed, until the number of pattern elements contained in each subregion is no greater than m. After the complete branching structure of the region is determined, representative figures are created for the pattern element(s) in the subregions thus formed, and respective contributions of the representative figures are calculated. The respective contributions are calculated in the same manner as in the first embodiment. Hence, the end result of the second embodiment is the same as with the first embodiment.

In yet another embodiment of a method according to the invention, a region of the reticle is selected that defines multiple pattern elements with respect to which cumulative exposure dose is to be determined. In the region, an evaluation point is identified at which cumulative exposure dose in the region is to be calculated. The region is subdivided in a branching manner into one or more sublevels of subregions. Each subregion has a respective reference point from which distance measurements concerning the respective subregion are to be taken If a subregion has a size parameter that, in a ratio to a distance between the respective reference point and the evaluation point, is greater than a specified value $\phi$, then the subject subregion is not further subdivided, and any pattern elements located in the subject subregion are converted into at least one corresponding representative figure. If the subregion contains a number of pattern elements that is no greater than a specified number m, then the subject subregion is not further subdivided, and the pattern element(s) in the subregion is regarded as its own respective representative figure. The two conditional steps noted above in this paragraph can be performed in either order. If a subregion does not satisfy either of these conditional steps, then the subject subregion is subdivided in a branching manner into a next-lower level of subregions. The conditional steps are repeated for each of the next-lower-level subregions. After the region has been subdivided exhaustively according to the above, respective contributions of exposure energy from each of the subregions to a cumulative exposure dose for the region are calculated. The resulting cumulative exposure dose is regarded as the cumulative exposure dose for the evaluation point in the region.

In the first embodiment summarized above, subdivision of a region and calculation of cumulative exposure energy were performed simultaneously, subregion-by-subregion as the subregions were designated. In the third embodiment summarized above, subdivision of the region and creation of representative figures are performed first. After the representative figures are created, the cumulative energy at the evaluation point is determined by combining the individual contributions from each of the respective subregions. Hence, the result of this embodiment is similar to the result of the first embodiment.

In yet another embodiment of a method according to the invention, a subject region is divided in a branching manner into one or more sublevels of subregions as required until each of the subregions thus formed contains a respective number of pattern elements no greater than a specified number m. Hence, a branching structure is created of subregions from the first level to an $n^{th}$ level. Each subregion has a respective reference point from which distance measurements concerning the respective subregion are to be taken.

If a subregion in an $i^{th}$ ($1 \leq i \leq n$) level has a size parameter that, in a ratio to a distance between the respective reference point and the selected evaluation point, is greater than a specified value $\phi$, then any pattern elements located in the subject subregion are converted into at least one corresponding representative figure. However, respective representative figures for pattern elements located in any lower-level subdivisions of the subject subregion are not created. If the subregion contains a number of pattern elements that is no greater than a specified number m, then the pattern element(s) in the subregion is regarded as its own respective representative figure. However, again, respective representative figures for pattern elements located in any lower-level subdivisions of the subject subregion are not created. If a subregion does not satisfy either of these conditional steps, respective representative figures are created for respective pattern elements contained in $(i+1)^{th}$-level subregions of the subject subregion. With respect to all subregions of the subject region from the first level to the $n^{th}$ level, the individual exposure-dose contributions from the representative figures in the subregions are summed to yield a cumulative exposure dose for the evaluation point in the region.

In yet another embodiment, the region is divided in a branching manner into one or more sublevels of subregions as required until each of the subregions thus formed contains a respective number of pattern elements no greater than a specified number m. Thus, a branching structure of subregions is created from the first level to an $n^{th}$ level. For each subregion thus formed, if the subject subregion contains a number of pattern elements that is no greater than a specified number m, then the pattern element(s) in the subject subregion is regarded as its own respective representative figure(s). If the subject subregion contains a number of pattern elements that is greater than the specified number m, then the pattern elements located in the subject subregion are converted into at least one corresponding representative figure.

For each subregion formed as summarized above, if the subject subregion has a size parameter that, in a ratio to a distance between the respective reference point and the selected evaluation point, is greater than a specified value $\phi$, then a contribution of the subject subregion to the cumulative exposure dose at the evaluation point is calculated without considering any contribution of lower-level subregions of the subject subregion to the cumulative exposure dose. If the subject subregion contains a number of pattern elements that is no greater than the specified number m, then a contribution of the respective representative figure(s) to the cumulative exposure dose at the evaluation point is calculated without considering any contribution of lower-level subregions of the subject subregion to the cumulative exposure dose. Either conditional step can be performed first. If a subregion does not satisfy either of the conditional steps, then, in the calculation of the respective contribution of the subject subregion to cumulative exposure dose, contributions of lower-level subregions of the subject subregion are included. The individual calculated exposure-dose contributions from all the subregions of the region are summed to yield a cumulative exposure dose for the evaluation point in the region.

In this method, as in other methods summarized above, branching division of the region is performed until the respective number of pattern elements included in any subregion is less than or equal to a specified number m. Meanwhile, representative figures are formed in all subregions, including subregions at lower levels in which, in other embodiments summarized above, representative figures were not determined. It would appear that this would require excessive calculation time. However, if a similarly configured subregion appears at multiple places, the cumulative energy calculation for the evaluation point can be performed once for such a subregion and the results of the calculation used wherever the subject subregion occurs. Thus, calculation time can be reduced substantially for certain patterns.

In any of the methods summarized above, if the number of pattern elements included in a subregion is less than or equal to 1, instead of regarding the respective reticle pattern element as its own representative figure, the pattern element can be converted into a respective representative figure having a simpler profile than the respective pattern element.

In any of the methods summarized above, if the number of pattern elements included in a subregion is no greater than a specified number m, then the respective pattern element can be regarded as its own representative figure. Alternatively, the pattern element can be converted into a respective representative figure having a relatively simple profile and usable for making cumulative-dose calculations, thereby simplifying the calculations.

In any of the methods summarized above, a pattern element can be divided into a combination of a core portion (e.g., having a relatively simple shape) and secondary portions located outside the core portion. One or more of the secondary portions can include portions having a negative shape. A separate cumulative energy calculation can be performed for the core portion (using conventional methods), with cumulative energy calculations for the secondary portions being performed using any of the above-summarized methods according to the invention. A cumulative exposure dose for a pattern element is obtained simply by adding the energy calculated for the respective secondary portions to the energy calculated for the respective core portion. This method variation can provide a more accurate and rapid determination of the respective exposure-dose contribution of, for example, a single complex pattern element present in a subregion. I.e., because the core portion has a simple profile, its contribution to cumulative exposure dose can be determined easily using conventional methods, saving the method according to the invention for calculating the respective contributions from the secondary portions.

Any of the processes summarized above can be recorded on a suitable computer-readable medium to allow automation of the method under the control of a computer. More than one method can be programmed on the same medium.

The foregoing and additional features and advantages of the invention will be more readily apparent from the following detailed description, which proceeds with reference to the accompanying drawings.

BRIEF DESCRIPTION OF THE DRAWINGS

FIGS. 12(a)–12(f) depict respective representative figures that can be derived for the elements shown in FIG. 12(a), as discussed in the seventh representative embodiment. The representative figures shown in FIGS. 12(b)–12(f) are situated in the center of the respective subregions.

DETAILED DESCRIPTION

Branching Division

Several embodiments of methods, according to the invention, for calculating cumulative exposure dose are set forth below. As a preface, the "branching division" of regions, used in calculating cumulative exposure dose, is described first, referring first to FIG. 1. Branching division of a region according to the invention yields a "branching structure" of the region as used in various embodiments described below.

Figures 1, 4:
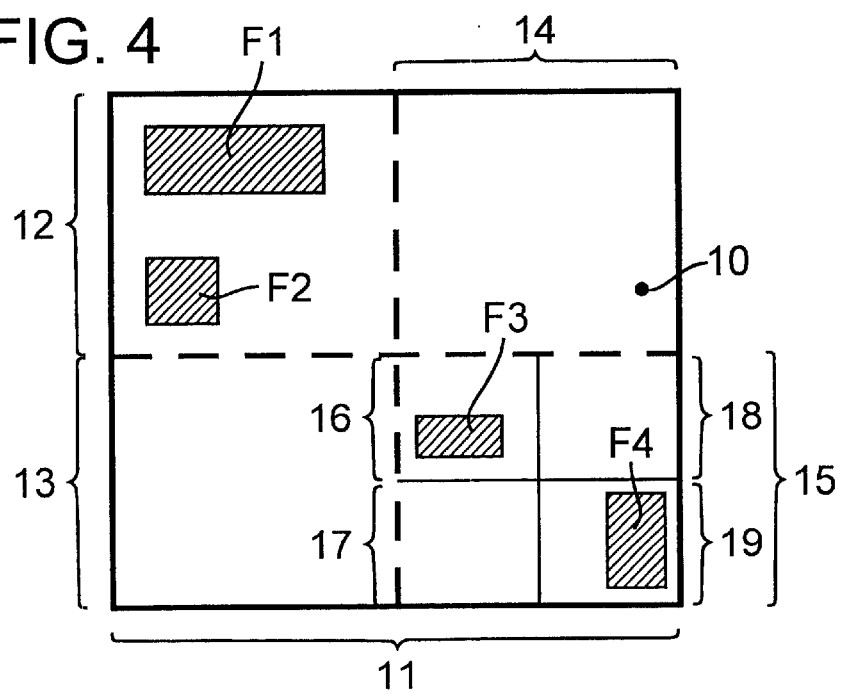
FIG. 1 schematically depicts a region of a reticle pattern that has been divided in a branching manner according to the invention. The region has been subdivided into 64 fourth-level subregions each identified with a respective number. In each subregion, the number in parentheses denotes the number of pattern elements contained within the respective subregion.
FIG. 4 depicts a region discussed in the first representative embodiment of a method, according to the invention, for calculating a cumulative dose of exposure energy that would be received by a corresponding location on a substrate exposed with the region.

FIG. 1 schematically depicts a region of a reticle pattern. The region includes multiple pattern elements (not shown) and is the subject of a calculation performed to determine the cumulative dose of exposure energy to be received by the region. The results of such a calculation will be used in configuring the pattern elements, as defined in the region on the reticle, in a manner that decreases the proximity effect experienced when the region is exposed onto the substrate. The region shown in FIG. 1 is divided into eight columns and eight rows, yielding a total of 64 subregions. Each subregion has a unique identifying number 1–64, respectively. In each subregion 1–64, the number in parentheses denotes the respective number of pattern elements contained in the subregion.

As a first example, when performing a branching division, the region is divided equally, horizontally and vertically, into four equally sized portions (i.e., divided into two columns and two rows). Each portion is divided further, horizontally and vertically, (according to certain rules as discussed below) into four smaller equally sized portions, and so on. As a second example, a region is divided into nine equally sized portions (i.e., divided equally horizontally and vertically to form three columns and three rows), and each portion is divided further (according to certain design rules) into nine smaller equally sized portions, and so on. As a third example, a region can be divided initially into sixteen equally sized portions (i.e., divided equally horizontally and vertical to produce four columns and four rows) or twenty-five equally sized portions (i.e., divided equally horizontally and vertically to produce five columns and five rows), and so on; however, these larger numbers of divisions quickly result in a large number of subregions that usually are too small and impractical. Also, when making a division, the number of vertical divisions and the number of horizontal divisions need not be always identical. For example, if it is known in advance that the region includes many vertically long pattern elements or many horizontally long pattern elements, a good result may result from changing the number of vertical or horizontal divisions accordingly.

In FIG. 1, division of a region or portion thereof is performed until the number of pattern elements included in the resulting subregions is one or less (i.e., 1 or 0). Initially, the number of pattern elements in the entire region (the entire region is referred to as "level 1") is greater than one. Hence, the entire level-1 region is divided into four "level-2" subregions consisting of, respectively, subregions 1–16, 17–32, 33–48, 49–64. Since the number of pattern elements in each of the level-2 subregions is greater than one, each level-2 subregion is further divided into four "level-3" subregions.

The number of pattern elements in the level-3 subregion consisting of subregions 9–12 and in the level-3 subregion consisting of subregions 37–40 is 0. As a result, further division of these level-3 subregions is not performed. Also, for example, the number of pattern elements in the level-3 subregion consisting of subregions 25–28 and the level-3 subregion consisting of subregions 41–44 is 1. Consequently, these level-3 subregions are not further divided. Level-3 subregions having more than one element are divided further to produce respective sets of four "level-4" subregions. At level 4, the number of pattern elements in each of the subregions is 1 or 0 in this example, so no further subdivision is performed.

Figure 2:
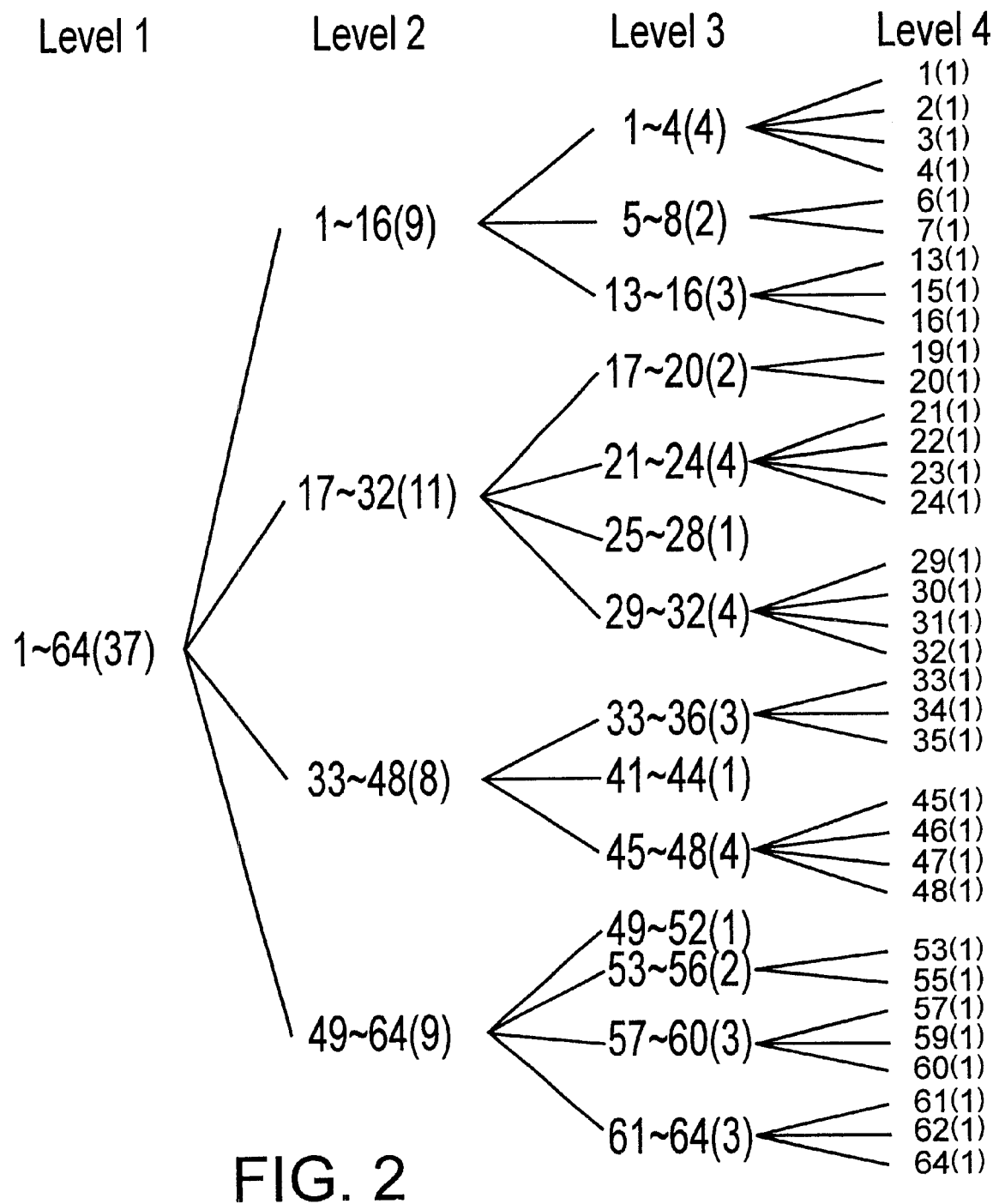
FIG. 2 shows an exemplary branching structure of the region shown in FIG. 1.

The scheme of branching division described above is diagrammed in the branching structure shown in FIG. 2. At each level shown in FIG. 2, the subregions included in each group are denoted by number. The numbers in parentheses denote the number of pattern elements included in each region or subregion at each level. In FIG. 2, subregions containing zero pattern elements do not affect the calculation, so further denotation and description of these "zero-element" subregions are not provided.

Figure 3:
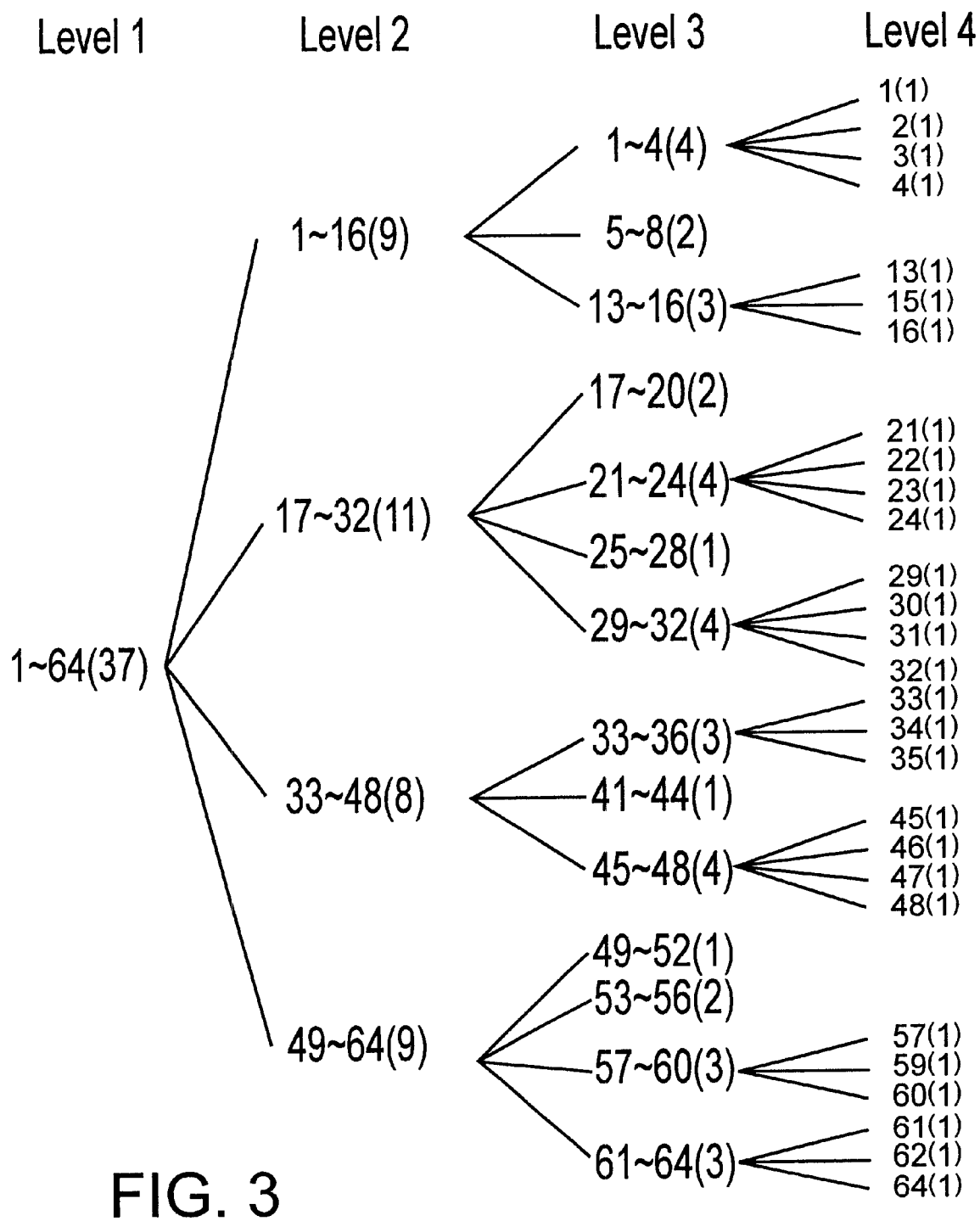
FIG. 3 shows a second exemplary branching structure of the region shown in FIG. 1.

In FIG. 1, branching division of a region alternatively can be performed until the number of pattern elements included in a resulting subregion is, for example, less than or equal to 2. First, the number of pattern elements included in the entire region (at level 1) is greater than 2, so the entire region is divided (equally horizontally and vertically) into four equally sized level-2 subregions consisting of subregions 1–16, 17–32, 33–48, and 49–64, respectively. The number of pattern elements included in each of the level-2 subregions is greater than 2 in each case, so each level-2 subregion is further divided into four equally sized level-3 subregions. The number of pattern elements in each of certain level-3 subregions (i.e., the subregion consisting of subregions 9–12 and the subregion consisting of subregions 37–40) is zero; and the number of pattern elements in each of certain other level-3 subregions (i.e., the subregion consisting of subregions 25–28 and the subregion consisting of subregions 41–44) is 1. Since the number of pattern elements in each of these level-3 subregions is two or less, further division of these level-3 subregions is not performed. Similarly, the number of pattern elements in each of certain other level-3 subregions (e.g., the subregion consisting of subregions 5–8, the subregion consisting of subregions 17–20, and the subregion consisting of subregions 53–56) is 2. Hence, these level-3 subregions also are not further subdivided. But, other level-3 subregions (e.g., the subregion consisting of subregions 13–16) have more than two elements each. Hence, each of these level-3 subregions is divided further into four equally sized subregions (level 4). At level 4 the number of pattern elements included in each subregion thus produced is either 1 or 0, so further subdivision is not performed. The results of this branching division are shown in FIG. 3. At each level shown in FIG. 3, the level-4 subregions included in each lower-order subregion are denoted by number. The numbers in parentheses denote the number of pattern elements included in the respective subregion at each level. In FIG. 3, subregions including no pattern elements do not affect the calculation, so further denotation and description of these "zero-element" portions are not provided.

First Representative Embodiment

In view of the branching-division schemes shown in FIGS. 1–3, the first representative embodiment is described with reference to FIGS. 4 and 5. FIG. 4 depicts an exemplary level-1 region of a pattern defining pattern elements that can be used to calculate a cumulative dose of exposure energy for the region. The point denoted "10" is a location ("evaluation point") at which a cumulative exposure dose is calculated. (The point 10 corresponds, for example, to any of the points $A_1$–$A_N$ in FIG. 20(c).) The reference numeral "11" denotes a side dimension of the level-1 region (and also is used herein to denote the level-1 region itself). Items 12–15 are respective level-2 subregions produced by dividing the region 11 (equally both horizontally and vertically) into four equally sized portions. The reference numerals 16–19 denote four level-3 subregions, respectively, produced by dividing the level-2 subregion 15 equally horizontally and vertically into four equally sized portions. Items F1–F4 are respective pattern elements in the region.

Figure 5:
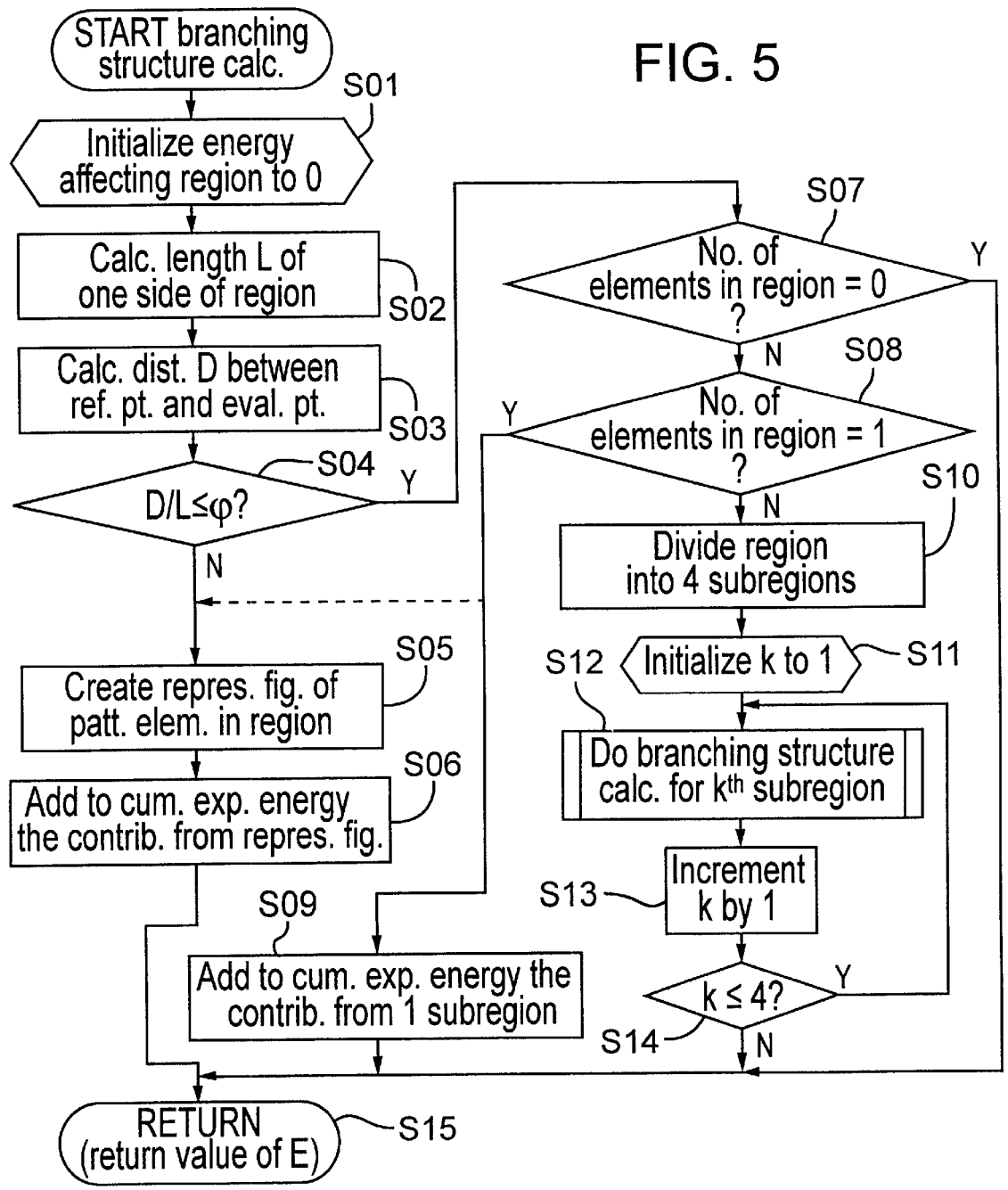
FIG. 5 is a flowchart of a method according to the first representative embodiment of the invention.

FIG. 5 is a flowchart of a process for calculating (determining) a branching structure according to this representative embodiment. In the description, the exemplary pattern region is assumed to contain more than one pattern element. In this example, the region is divided evenly both vertically and horizontally to produce four equally sized lower-level subregions. If the number of pattern elements within a subregion is ≦1, then further subdivision of the respective subregion is not performed. In the figure, D is the distance between the center of a subject subregion (the center serving in this example as a "reference point" for the subregion) and the evaluation point 10, and L is the length of a side of the subregion. For the subregion, if the ratio D/L exceeds a threshold value φ, then further subdivision of the respective subregion is not performed regardless of the number of pattern elements included in the subject subregion, and the pattern element(s) present in the subject subregion are converted into a respective representative figure. The threshold value φ normally is determined experimentally, taking into account the required accuracy with which cumulative exposure dose is to be calculated and the desired calculation time.

The "representative figure" for a given subregion is located at the centroid of pattern element(s) in the subject subregion. The representative figure includes a weighted factor of the total area of the pattern element(s) present in the subregion. The weighted factor is a compensation factor that takes into account the fact that the representative figure is an approximation of reality, even if the representative figure is situated at the centroid. The weighted factor is applied to the contribution by the element(s) to cumulative exposure dose in the subregion. The representative figure can have any of various profiles. Also, there need not be only one representative figure for a given subregion. Furthermore, a subject subregion can be subdivided into sub-subregions, with a respective representative figure created for each sub-subregion.

Referring further to FIG. 5, in step S01 the cumulative dose of exposure energy in the subject region is initialized to 0. Further aspects of FIG. 5 are described in the context of FIG. 4. In step S02, the length L of a side of the region 11 is determined (wherein L is a representative size parameter of the region). In step S03 the distance D is determined between the center of the region 11 (the center serving as a "reference point") and the selected evaluation point 10 (at which cumulative exposure dose is calculated). In step S04 a decision is made on whether D/L exceeds a threshold value φ. If D/L does not exceed φ, then the process proceeds to step S07 at which a decision is made on whether the number of pattern elements in the region 11 is 0. If the number of pattern elements in the region 11 is greater than 0, then the process proceeds to step S08 at which a decision is made on whether the number of pattern elements in the region 11 is equal to 1. If the number of pattern elements in the region 11 is greater than 1, then the process proceeds to step S10 at which the region 11 is divided equally into four subregions 12–15. In step S11, a number k indicating the subregion number is initialized to 1, and the process proceeds to step S12. In step S12 a calculation starting with step S01 is performed for the subregions obtained.

In step S13 k is incremented by 1. In step S14, if k is less than or equal to 4, then the process returns to step S12 and a branching structure is determined for the next subregion. If k is greater than 4, then calculation ends for all the subregions, thereby completing processing for the region.

In the example shown in FIG. 4, for k=1 (level-2 subregion 12), D/L exceeds the threshold value φ. As a result, for this subregion, the process proceeds to steps S05 and S06, in which a representative figure is created from the pattern elements F1, F2. The contribution of the representative figure to cumulative exposure dose is calculated, and the sum is added to the cumulative exposure dose for the region. In step S15 the value E is entered and the process "returns" to the last division in the branching structure. This means that, for k=1, no further subdivisions or energy calculations are performed. Consequently, the process proceeds to step S13 during which the value of k becomes 2, and the level-2 subregion 13 now is considered. Step S12 is performed for the subregion 13. That is, with k=2, the process starting at step S01 is performed for the subregion 13.

For k=2, D/L exceeds the threshold value φ in the subregion 13. As a result, the process proceeds to steps S05 and S06. However, because no pattern elements are present in the subregion 13, a calculation and adding of the respective exposure-dose for this subregion to the overall exposure dose for the region 11 do not occur. Hence, k is incremented to k=3.

For k=3 (level-2 subregion 14), D/L does not exceed the threshold value φ, and the process proceeds to step S07. However, because no pattern elements are present in the subregion 14, the process proceeds to step S15.

For k=4 (level-2 subregion 15), D/L is less than the threshold value φ, and the process proceeds to step S07. But, because the number of pattern elements in the subregion 15 is greater than 0, the process proceeds to step S08. Since the number of pattern elements in the subregion 15 is greater than 1, in step S10 the subregion is divided into four level-3 sub-subregions 16–19. The process starting with step S01 is performed for each of the four sub-subregions 16–19 from k=1 to k=4, respectively.

For each of the four level-3 subregions, since D/L≦φ for k=1 to k=4, the process proceeds to step S07. For k=1 (sub-subregion 16) and k=4 (sub-subregion 19), the number of pattern elements in each respective sub-subregion is 1. As a result, the process proceeds in each instance to step S09, in which the contribution of the pattern elements F3, F4, respectively, to cumulative exposure dose is added to the cumulative exposure dose for the region 11. These contributions to cumulative exposure dose can be calculated from the shape of the respective pattern elements using well-known methods. Alternatively, as described previously, the process can proceed to step S05, as indicated by the broken-line arrow in FIG. 5, in which, for each sub-subregion, the respective pattern element is converted into a representative figure, and the contribution of the representative figure to cumulative exposure dose is calculated.

For each of k=2 (sub-subregion 17) and k=3 (sub-subregion 18), the number of pattern elements is 0, so the process proceeds from step S07 to step S15.

To summarize the process, first the region 11 is divided into four level-2 subregions 12–15. The contribution of subregion 12 to cumulative exposure dose is calculated in steps S05 and S06 and added to the cumulative exposure dose for the region 11. Each of the subregions 13 and 14 has no pattern elements, so no exposure dose from these two subregions can be added to the cumulative exposure dose. The subregion 15 is divided into four sub-subregions (level-3 subregions) 16–19. The respective contributions to cumulative exposure dose from the sub-subregion 16 and the sub-subregion 19 are calculated in step S09 and added to the cumulative exposure dose for the region 11. Each of sub-subregions 17 and 18 has no pattern elements, so no exposure dose is contributed by these two sub-subregions to the cumulative exposure dose for the region 11. A calculation of exposure dose in the region 11 is made for each evaluation point 10 in the region 11.

Second Representative Embodiment

Figure 6:
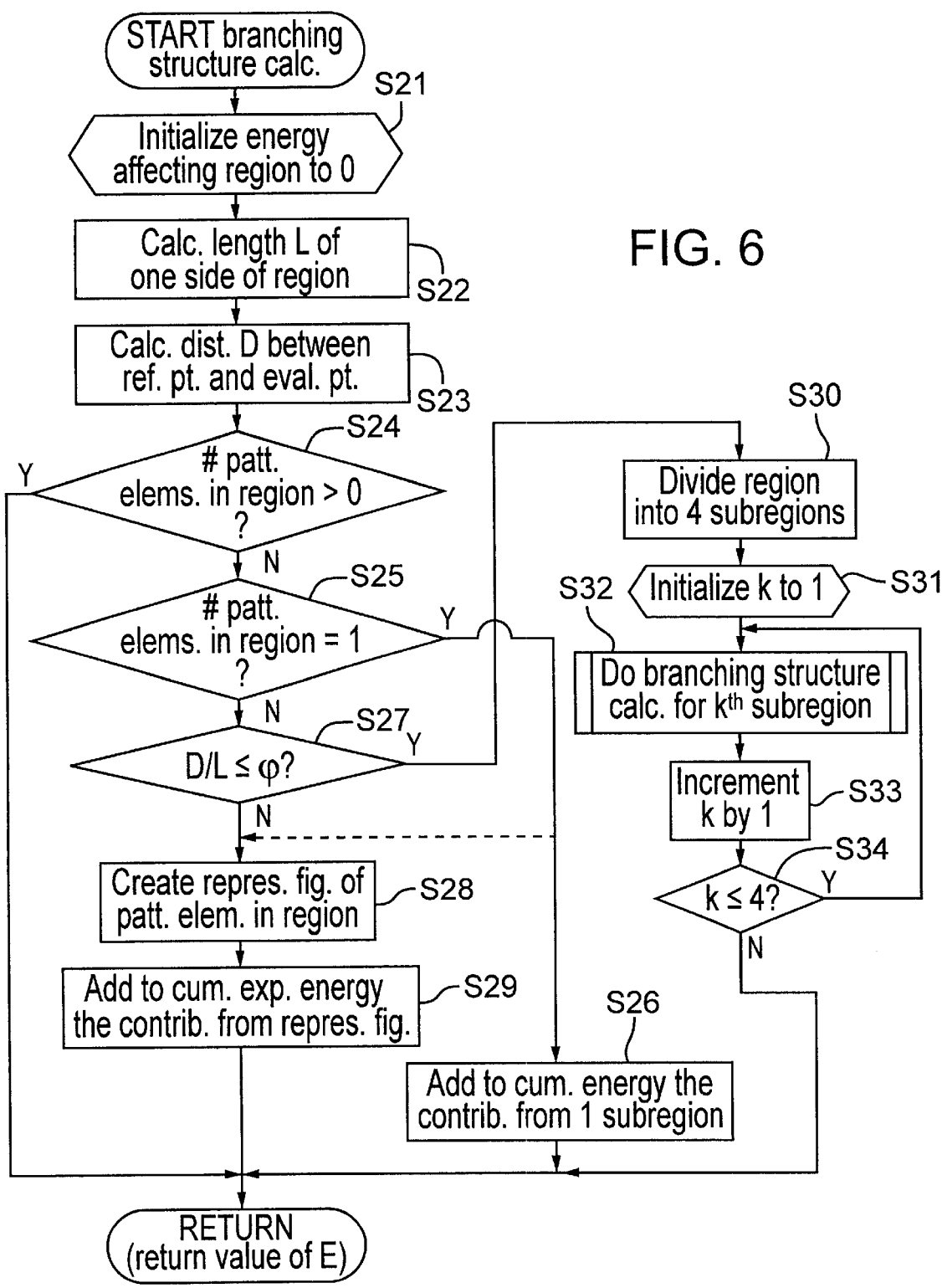
FIG. 6 is a flowchart of a method according to the second representative embodiment of the invention.

A flowchart of a process according to this embodiment is shown in FIG. 6. The basic concept of the FIG.-6 process is as in the FIG.-5 process, and has a similar end effect. The main difference between the two processes is that, in the FIG.-5 process, the decision as to whether $D/L \leq \phi$ is made before a decision on whether the number of pattern elements in a region or subregion is less than or equal to 1. In contrast, in the FIG.-6 process, this sequence of steps is reversed. Hence, both processes have similar end effects.

Referring more specifically to FIG. 6 (and referring also to FIG. 4), in step S21 the cumulative exposure dose affecting the region is initialized to 0. In step S22, the length L of one side of the region (wherein L is a representative size parameter) is determined. In step S23 the distance D between the center of the region and the evaluation point 10 is determined. This portion of the process also can occur between step S25 and step S27, described later.

In step S24, a decision is made on whether the number of pattern elements in the region is 0. If the number is 0, then the process proceeds to step S35, and no further processing occurs for the region. If the number is greater than 0, then the process proceeds to step S25, and a decision is made on whether the number of pattern elements in the region is 1. If the number is 1, then the process proceeds to step S26, and the exposure-dose contribution of the subject region is added to the cumulative exposure dose for the region 11. During this step, the exposure-dose contribution to the cumulative exposure dose can be calculated from the shape of the respective pattern element using well-known methods. Alternatively, as indicated by the broken-line arrow in FIG. 6, the process can proceed to step S28, described below, during which the respective pattern element is converted to a representative figure, and the contribution to cumulative exposure dose is calculated from the representative figure.

If the number of pattern elements in the subject region is 2 or more, then the process proceeds to step S27, and a decision is made on whether $D/L \leq \phi$. If $D/L \leq \phi$, then the process proceeds to steps S28 and S29, and a representative figure is created from the pattern elements. The contribution of the representative figure to cumulative exposure dose is calculated and added to the cumulative dose of exposure energy for the region 11. In step S35 the value of E is entered, meaning that the process is complete with respect to the subject region or subregion. The process then "returns" to the last division in the branching structure and proceeds again.

If $D/L \leq \phi$, then the process proceeds to step S30, and the region is divided into four equally sized subregions. Thereafter, steps S31 through S34 are the same as steps S11 through S14, respectively, in FIG. 5.

Third Representative Embodiment

In the embodiment of FIG. 6, branching division of a region and calculation of cumulative exposure dose are performed simultaneously. However, in this third representative embodiment, entry of the subject region (or subregion) into a branching structure for the region occurs first, followed by calculation of the cumulative exposure dose in the region (or subregion).

Figure 7:
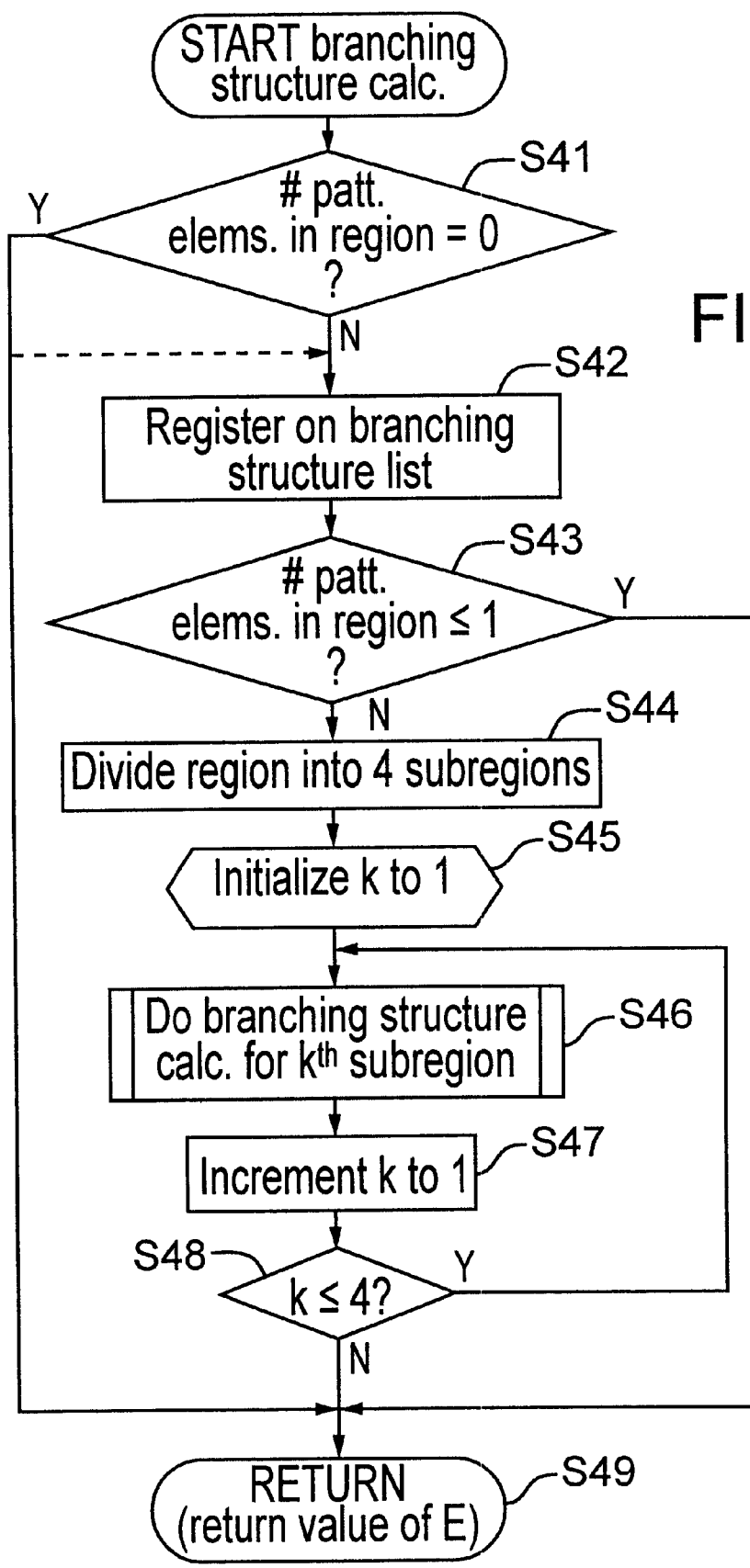
FIG. 7 is a flowchart of a method, according to the third representative embodiment of the invention, for making a branching structure of a subject region.

The third representative embodiment is shown in FIG. 7. In step S41, a decision is made on whether the number of pattern elements in the subject region (or subregion) is 0. If the number is 0, then the process proceeds to step S49. Alternatively, the process can proceed to step S42, wherein the region (or subregion) is listed ("registered") on a branching structure being created for the region, with the number of pattern elements set at 0 on the list. (Branching structures are created in a memory of a computer used to perform the steps of the process in a controllable manner.) However, in light of subsequent processing, it is more efficient not to register the region on a branching structure. I.e., not registering a region or subregion results in less calculation time.

If the number is not zero, then in step S42 the region (or subregion) is registered on the branching structure, and the number of pattern elements included in the region is recorded. That is, as shown in FIG. 2, the subregions for each level and the number of pattern elements included in the respective subregions are registered on the branching structure. Then, in step S43, a decision is made on whether the number of pattern elements in the region (or subregion) is less than or equal to 1. If yes, then the process proceeds to step S49. If no, then the process proceeds to step S44, at which the subject region (or subregion) is divided (equally horizontally and vertically) into four equally sized subregions. Branching division according to step S46 is performed for each respective subregion produced in step S44. That is, the process starting with step S41 is performed for each of the respective subregions formed in step S44. By continuing this process for the entire region shown in FIG. 1, a branching structure such as that shown in FIG. 2 is created. (FIG. 2 shows a case in which regions with zero pattern elements are not registered on the branching structure. But, if regions with zero pattern elements were registered on the branching structure, then those elements would be included in the regions listed in FIG. 2.)

As branching division of a region ends, calculation of a cumulative dose of exposure energy in the region begins. The calculations are performed by a process shown in FIG. 8, in which only regions (and subregions) containing pattern elements are regarded as registered in the branching structure. Calculations are performed only for those regions and subregions that are registered in the branching structure, thereby providing greater efficiency than conventional methods.

Figure 8:
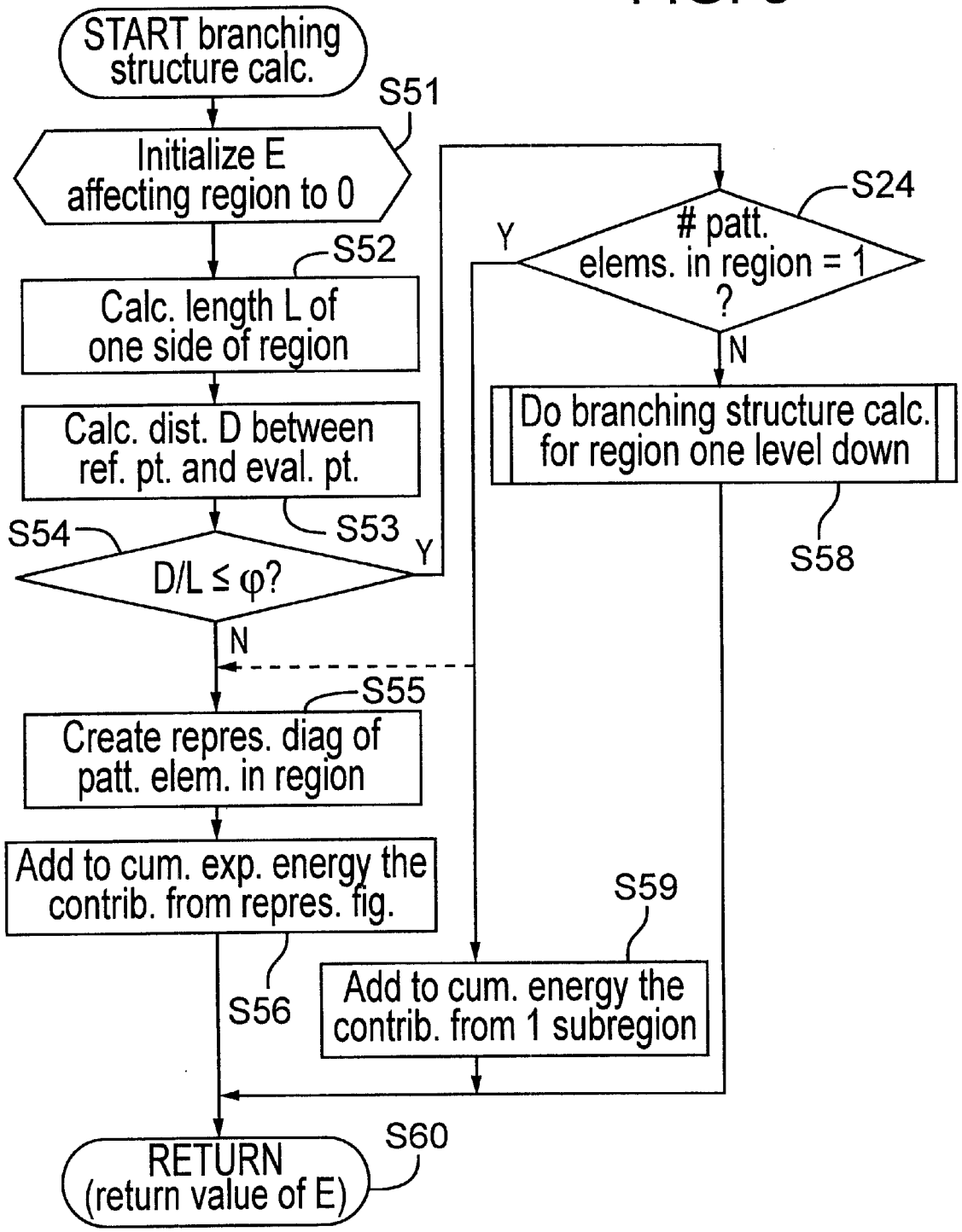
FIG. 8 is a flowchart of a method, according to the third representative embodiment of the invention, for calculating cumulative exposure dose for the subject region.

In step S51 of FIG. 8, the cumulative dose of exposure energy affecting a region is initialized at 0. In step S52 the length L of one side of the region is determined (wherein L is a representative size parameter). In step S53 the distance D between the center of the region (as a respective reference point for the region) and the evaluation point in the region is selected. In step S54 a decision is made on whether $D/L$ exceeds the threshold value $\phi$. If yes, then the process proceeds to steps S55 and S56, and a representative figure is created from the pattern element(s) in the region. The contribution of the representative figure to the cumulative exposure dose (energy) is calculated and added to the cumulative dose of exposure energy for the region. In step S60 the value of exposure dose (energy E) determined in a previous step is entered, indicating that processing in the respective region or subregion is complete. The process then returns to the last division in the branching structure and proceeds again, and so on until the entire region is completed.

If $D/L \leq \phi$, then the process proceeds to step S57 in which a decision is made on whether the number of pattern elements in the subject region or subregion is 1. If the number is 1, then the process proceeds to step S59 in which the contribution to cumulative exposure dose from the subject pattern element is added to the cumulative dose of exposure energy for the region. (The contribution of a pattern element to cumulative exposure dose can be calculated from the shape of the subject pattern element using well-known methods.) As indicated by the broken-line arrow in FIG. 8, it alternatively is possible to proceed to step S55 and convert the subject pattern element to a representative figure, from which the respective contribution to cumulative exposure dose is calculated.

If the number of pattern elements in the region is greater than 1, then the process proceeds to step S58 in which a branching structure is determined ("calculated") for the next lower level from the subject region or subregion. That is, calculation (starting from step S51) is performed for all subregions registered at the next lower level.

By continuing the process in this manner to the end, the cumulative dose of exposure energy is determined for the entire region with respect to a particular evaluation point. The process is repeated for each of the other evaluation points in the region.

In the process shown in FIG. 8, the determination of whether $D/L \leq \phi$ is made before the decision on whether the subject region or subregion contains a single pattern element. Alternatively, the decision on whether the subject region or subregion contains a single pattern element can be made before a determination of whether $D/L \leq \phi$. In the latter instance, the sequence of process steps readily can be determined by applying the difference between FIGS. 6 and 7 to FIG. 8.

Fourth Representative Embodiment

This embodiment is directed to a method in which, for a given region, the determination of the branching structure and creation of representative figures are performed first, followed by a determination and summation of the respective contributions of the respective pattern elements and representative figures to cumulative exposure dose.

Figure 9:
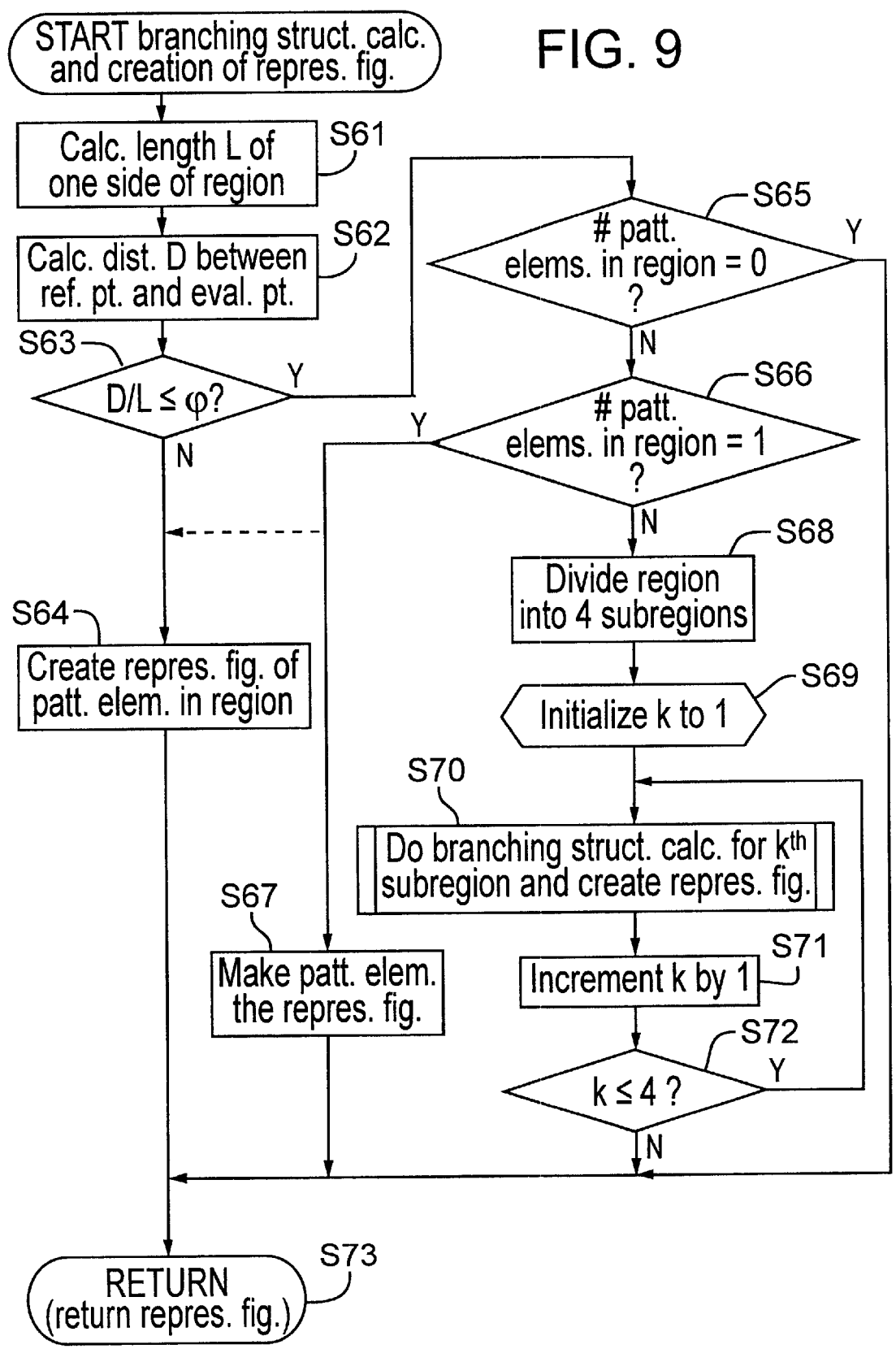
FIG. 9 is a flowchart of a method according to the fourth representative embodiment of the invention.

FIG. 9 provides a process flowchart of this embodiment. In the first step, step S61, the length L of one side of the subject region (as a representative size parameter) is determined. In step S62 the distance D is determined between the center of the region (as a representative "reference point" for the region) and the selected evaluation point. In step S63 a decision is made on whether D/L exceeds the threshold value $\phi$. If $D/L > \phi$, then the process proceeds to step S64, in which a representative figure is created from the pattern elements in the region. Then, in step S73, the representative figure is returned (entered), thereby completing the process.

If $D/L \leq \phi$, then the process proceeds to step S65, in which a decision is made on whether the number of pattern elements in the subject region (or subregion) is zero. If the number is zero, then the process proceeds to step S73 and processing for the particular region (or subregion) ends. If the subject region (or subregion) contains at least one element, then the process proceeds to step S66, in which a decision is made on whether the number of pattern elements in the region (or subregion) is 1. If the number is 1, then the process proceeds to step S67, in which the pattern element itself becomes the representative figure. Alternatively, as indicated by the broken-line arrow in FIG. 9, the process can proceed from step S66 to step S64, in which the pattern element is converted into a representative figure.

If the number of pattern elements in the subject region (or subregion) is greater than 1, then the process proceeds to step S68, in which the subject region (or subregion) is divided (equally horizontally and vertically) into four equally sized subregions. The steps (S69 through S72) of determining a branching structure and creating a representative figure are performed for each of the four subregions. That is, the routine starting at step S61 is performed for each subregion.

By continuing this process to its end, all representative figures are found for the subject region. Furthermore, in the process of FIG. 9, the decision on whether $D/L \leq \phi$ is made before making a decision on whether the number of pattern elements in the subject region is 1. Alternatively, it is possible to make the decision on whether there is one pattern element in the region before making the decision on whether $D/L \leq \phi$. In the latter instance, the sequence of process steps readily can be determined by applying the difference between FIGS. 6 and 7 to FIG. 9.

After all representative figures are found in this manner, the contributions of the respective representative figures to the cumulative dose of exposure energy at the evaluation point are determined. The process is repeated for all other evaluation points in the region.

Fifth Representative Embodiment

In all of the foregoing embodiments, representative figures were created with reference to respective relationships of the various subregions of a region with the selected evaluation point in the region. It also is possible to divide the region in a branching manner and create representative figures without consideration of these relationships. In the latter instance, the respective relationships are referred to only when calculating the cumulative dose of exposure energy for the region. This embodiment is exemplary of such a scheme.

Figure 10:
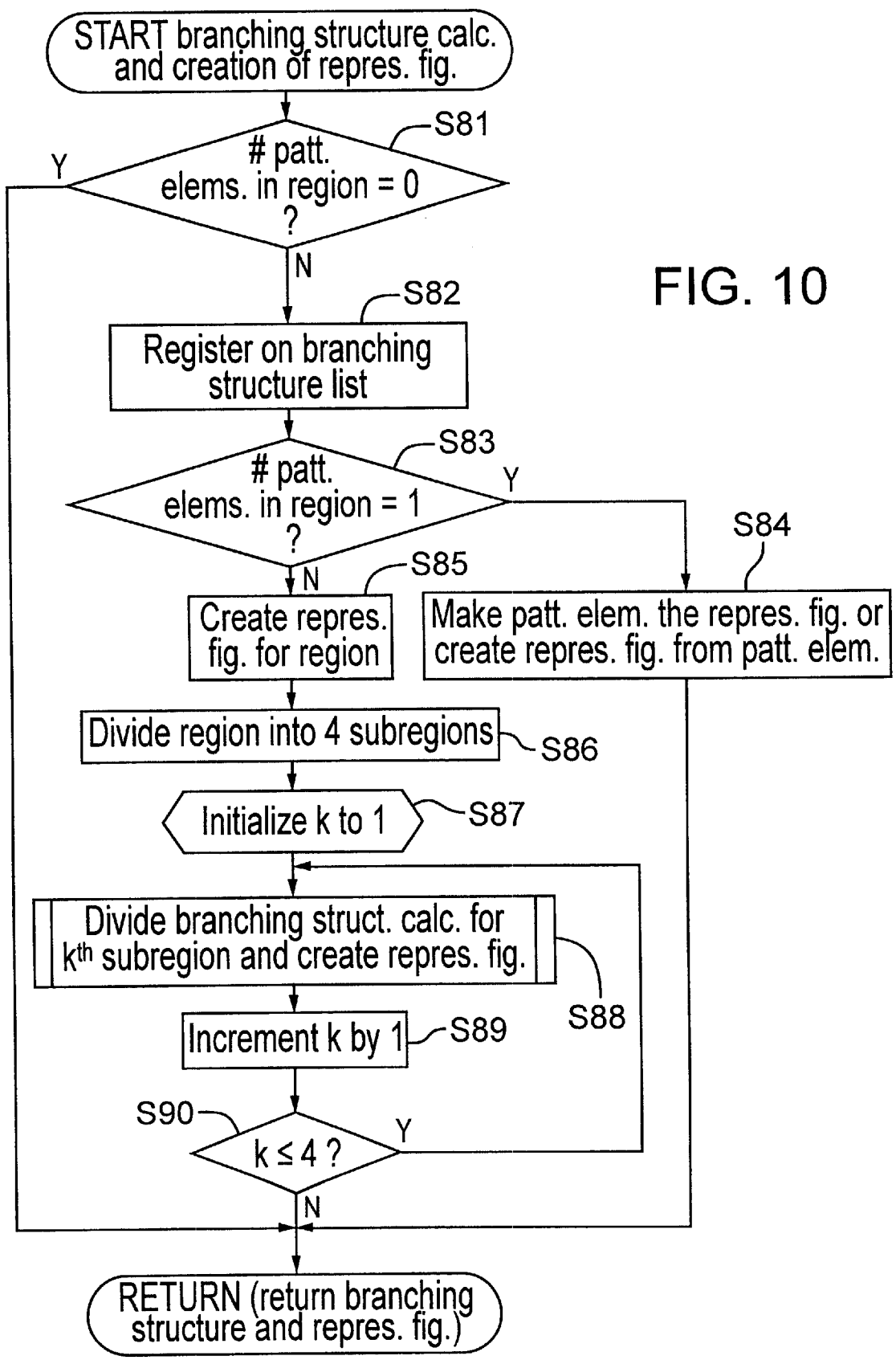
FIG. 10 is a flowchart of a method according to the fifth representative embodiment of the invention.

A process according to this embodiment for dividing a region in a branching manner and creating representative figures in the subregions thus formed is shown in FIG. 10. In step S81, a decision is made on whether the number of pattern elements in the subject region (or subregion) is zero. If the number is zero, then the process proceeds to step S91 and further processing of the region (or subregion) ends. If the number is not zero, then in step 81 the subject region (or subregion) is registered on the branching structure being created for the region. Then, in step S83, a decision is made on whether the number of pattern elements in the subject region (or subregion) is one. If yes, then the process proceeds to step S84, in which the subject pattern element becomes the representative figure, or a specified representative figure is created from the subject pattern element. The process then proceeds to step S91 and further processing of the region (or subregion) ends.

In step S83, if the number of pattern elements in the region (or subregion) is two or more, then the process proceeds to step S85, in which a representative figure is created for the subject region (or subregion). In step S86 the subject region (or subregion) is divided equally horizontally and vertically into four subregions at the next lower level (the subregions are equally sized). Branching division in this manner creates a respective portion of the branching structure for the region, and representative figures are created for each of the respective subregions in step S87 through step S90. That is, the process starting from step S81 is performed for each of the respective subregions.

Performing this process to completion for all subregions of the region yields a branching structure as shown in FIG. 2, including representative figures corresponding to the respective subregions.

Sixth Representative Embodiment

Figure 11:
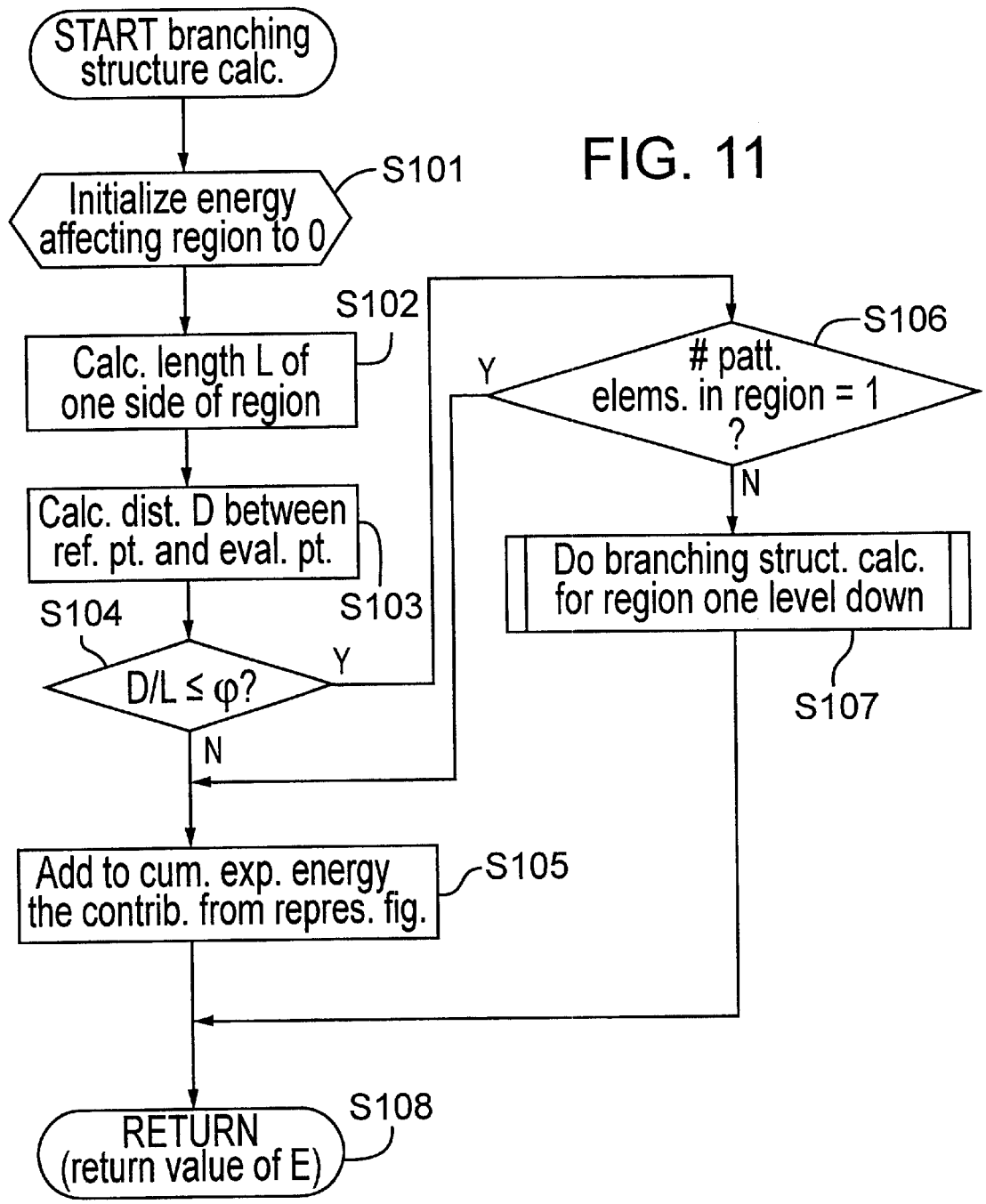
FIG. 11 is a flowchart of a method according to the sixth representative embodiment of the invention.

This embodiment is directed to calculating cumulative dose of exposure energy using a branching structure and representative figures. The process flow is shown in FIG. 11. In the first step S101 the cumulative dose of exposure energy to the respective region is initialized at zero. In step S102 the length L of one side of the subject region (or subregion) is found, wherein L is a representative size parameter. In step S103 the distance D is found between the center of the region (or subregion) and the selected evaluation point for the region, wherein the center is a representative "reference point" for the region or subregion. In step S104 a decision is made on whether D/L exceeds the threshold value φ. If D/L>φ, then the process proceeds to step S105, in which the contribution of the representative figure(s) in the region or subregion to the cumulative dose of exposure energy (E) for the region is calculated. In step S108 the value of E is returned (entered), meaning that processing in the subject region (or subregion) is complete.

If D/L≦φ, then the process proceeds to step S106, in which a decision is made on whether the number of pattern elements in the subject region (or subregion) is 1. If the number of pattern elements is 1, then the process proceeds to step S105, in which the contribution to cumulative exposure dose from the representative figure in the subject region (or subregion) is added to the cumulative exposure dose. In this step, the subject representative figure can be the corresponding pattern element itself. Alternatively, the pattern element can be converted into a representative figure having a specified shape according to step S84 in FIG. 10.

If the number of pattern elements in the subject region (or subregion) is greater than 1, then the process proceeds to step S107, in which a branching structure is created for subregions at the next lower level from the subject region (or subregion). That is, the calculation is performed, starting with step S101, for all subregions one level down.

By continuing this process to the end for all constituent subregions, the cumulative exposure dose at the selected evaluation point is determined for the subject region. (The process is repeated for all other evaluation points in the region.) Furthermore, in the process shown in FIG. 11, the decision on whether D/L≦φ is made before the decision on whether there is one pattern element in the region (or subregion). Alternatively, the decision on whether there is one pattern element in the region (or subregion) can be made before the decision on whether D/L≦φ. In the latter instance, the sequence of process steps readily can be determined by applying the difference between FIGS. 6 and 7 to FIG. 11.

In all of the embodiments discussed above, the decision to subdivide a region (or subregion) is made whenever D/L>φ or whenever the number of pattern elements included in the subject region (or subregion) is less than or equal to one. Alternatively, division of a region (or subregion) into subregions at the next lower level may end whenever D/L>φ or whenever the number of pattern elements included in the subject region (or subregion) is less than or equal to a specified number. The latter can be implemented readily by denoting step S08 (FIG. 5) as "number of elements in the region≦a specified number", for example. In the latter instance, regions or subregions having a plurality of pattern elements remain, but the contribution to the cumulative exposure dose of the respective pattern elements can be calculated. For example, the representative figure in the region or subregion can be found via the broken-line route in FIG. 5.

Seventh Representative Embodiment

Figure 12A:
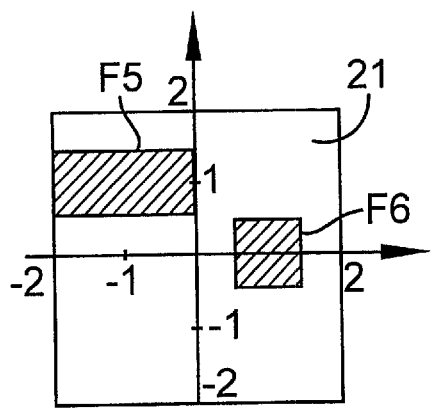
FIG. 12(a) shows an exemplary subregion containing two pattern elements.

This embodiment is directed to an exemplary method for creating a representative figure. Referring to FIG. 12(a), a situation is considered in which a region 21 contains two pattern elements F5 and F6. The region 21 is square-shaped with side length 2. The element F5 is rectangularly shaped with a length of 2 units in the x-axis direction (horizontal direction in the plane of the page) and a width of 1 unit in the y-axis direction (vertical direction in the plane of the page). If the center of the region 21 is the selected evaluation point in the region 21, then the center of the element F5 is located at (−1,1). The element F6 is square-shaped, with each side having a length of 1 unit. The center of the element F5 is located at (1,0).

FIGS. 12(b)–12(f) show various respective ways in which the elements F5, F6 in the region 21 can be combined into a single representative figure in the region 21.

Figure 12B:
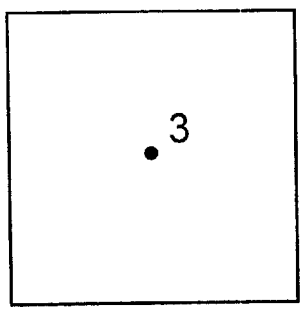

Turning first to FIG. 12(b), the representative figure is a point located at the center of the region 21. Such a representative figure is applicable, for example, if the respective element is located remotely from the evaluation point. For evaluation purposes, the point has a "weight" of 3, which is the total of the areas of F5 and F6. I.e., even though the representative figure is a point, it still takes into consideration the area of the element(s) it represents. In this context, "weight" is essentially a factor used when calculating a respective contribution to cumulative exposure dose. Whether or not a point representative figure is or can be used also takes into account the required accuracy of the calculations and/or the calculation time.

Figure 12C:
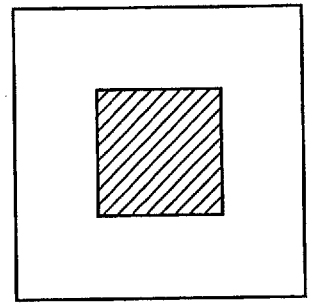
Figure 12D:
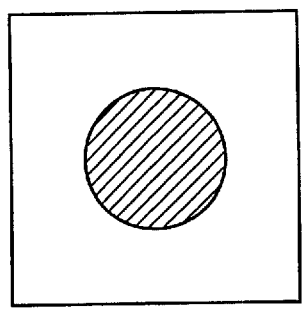
Figure 12E:
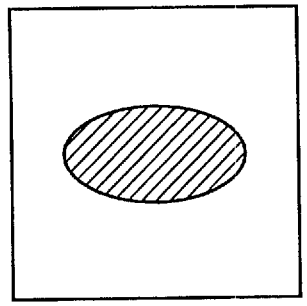
Figure 12F:
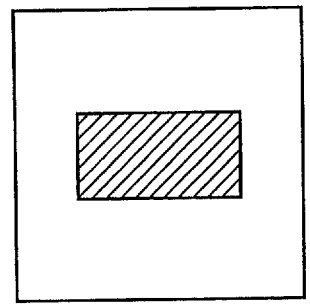

FIG. 12(c) is an exemplary square representative figure having a center located at the center of the region 21 and having an area of 3 (which is the total of the areas of the elements F5 and F6). FIG. 12(d) is an exemplary round representative figure having a center located at the center of the region 21 and having an area of 3 units (which is the total of the areas of the elements F5 and F6). FIGS. 12(b)–12(d) do not consider the net relative extensions in the x- and y-directions of the elements F5 and F6. Such a consideration is provided in FIG. 12(e), in which the representative figure is elliptical and horizontally extended. In the ellipse, the ratio of x-axis length to y-axis length is 3.5:2. The ellipse has an area of 3 units, which is the total of the areas of the elements F5 and F6. The axial ratio of the ellipse is derived from corresponding x- and y-dimensions of a rectangular figure, surrounding elements F5 and F6, having a length of 3.5 in the x-axis direction and a length 2 in the y-axis direction. FIG. 12(f) shows an exemplary rectangular representative figure of which the ratio of x-axis length to y-axis length is 3.5:2. The area of the rectangle is 3 units, which is the total of the areas of the elements F5 and F6.

Figure 13A:
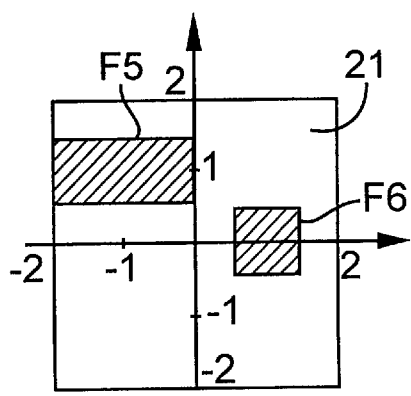
FIGS. 13(a)–13(f) are similar to FIGS. 12(a)–12(f), respectively, except that, in FIGS. 13(b)–13(f), the representative figures are situated at the center of the respective centroids of the pattern elements in the respective subregions.
Figure 13B:
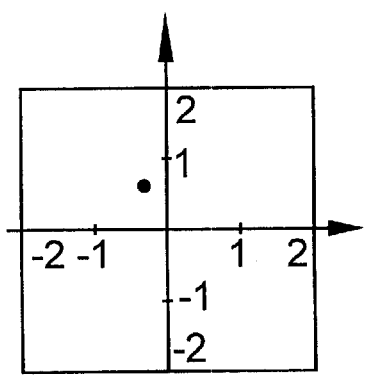
Figure 13C:
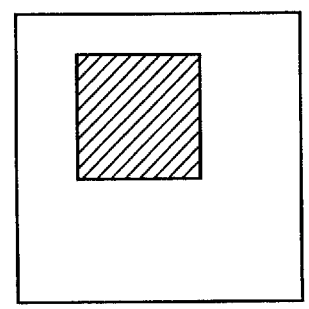
Figure 13D:
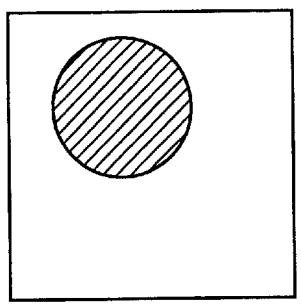
Figure 13E:
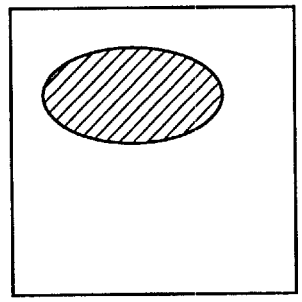
Figure 13F:
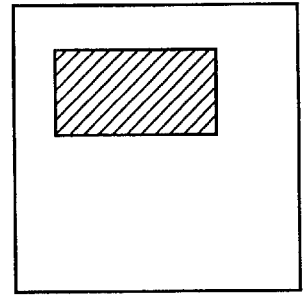

In FIGS. 12(a)–12(f), the locations of the respective centers of the representative figures are at the center of the region 21. Alternatively, the centers can be located at the center of the respective centroid of the pattern elements F5 and F6 in the region 21, thereby providing a more accurate representative figure. This is shown in FIGS. 13(a)–13(f). FIG. 13(a) shows the dispersion of pattern elements F5, F6 in the region 21. As can be seen, the pattern elements F5, F6 are distributed and sized exactly as in FIG. 12(a). The location of the centroid of elements F5 and F6 is located at (−1/3,2/3), at which the center of the representative figure is located. FIGS. 13(b)–13(f) show exemplary representative figures corresponding to FIGS. 12(b)–12(f), respectively, but with respective centers situated at (−1/3,2/3).

In FIGS. 12(a)–12(f) and 13(a)–13(f), one representative figure was created in the region 21, incorporating multiple pattern elements F5, F6. It also is possible to create multiple representative figures in the region 21. In the latter case, for example, the region 21 is divided equally horizontally and vertically into four equally sized subregions, and a respective representative figure is created for each subregion. As discussed above, the number of divisions does not have to be equal horizontally and vertically. If many pattern elements have respective shapes that are long horizontally or long vertically, then the number of horizontal and vertical divisions can be modified accordingly.

In the methods for dividing a region in a branching manner explained above, subregions distant from the selected evaluation point can be configured as large subregions, and subregions nearer to the evaluation point can be configured as small subregions. This is because the cumulative-dose effect of subregions more distant from the evaluation point is less than the effect of closer subregions. This allows the number of calculations to be minimized without significantly degrading the accuracy of the calculations.

If a single large pattern element, having a complicated edge profile, is present in the subject region, then subdivision of the region ordinarily would not occur. In such a case, accuracy would not be affected adversely if exposure dose were calculated strictly according to the complex profile of the element, but the calculation time would be excessive. Alternatively, the complex pattern element can be replaced with a representative figure from which the exposure-dose calculation is performed. However, in a representative figure, the complex profile of the element essentially is ignored, and calculation accuracy is reduced undesirably. In such a situation, it is desirable to divide the single complex element into a core portion having a simple profile and multiple "secondary" portions (including portions having a negative profile). With respect to the core portion, cumulative exposure dose can be calculated using conventional methods. I.e., because the profile of the core portion is simple, known rapid calculation methods can be used. With respect to the secondary portions, determination of a branching structure as described above can be performed. The cumulative exposure dose from the element is obtained by combining the results of the two calculations.

Figures 14A, 14B:
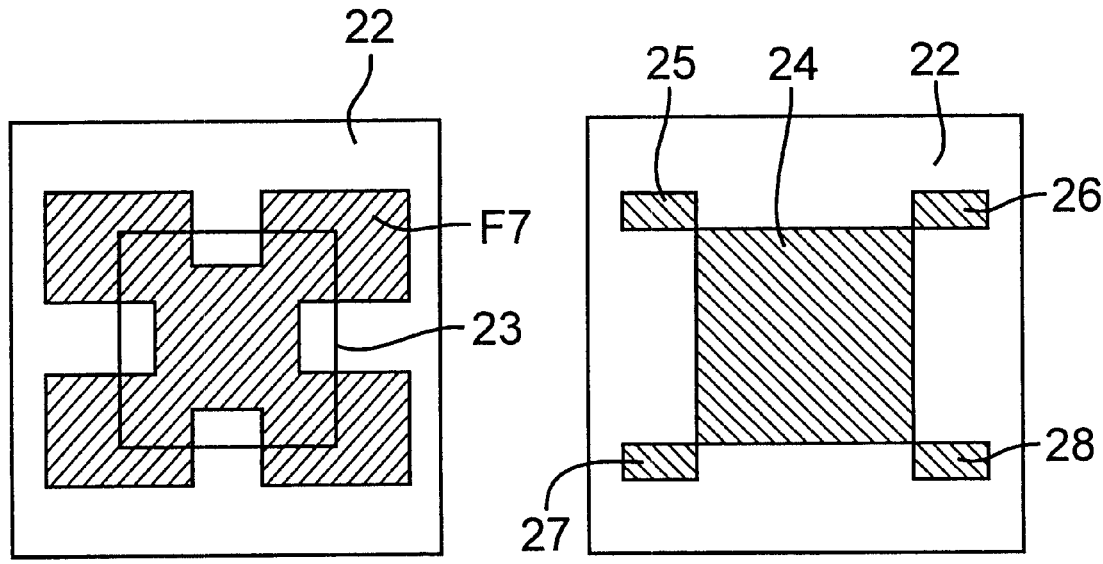
FIG. 14(a) depicts an exemplary complex pattern element.
FIGS. 14(b)–14(c) depict the corresponding core portion and secondary portions, respectively, as discussed in the seventh representative embodiment.
Figure 14C:
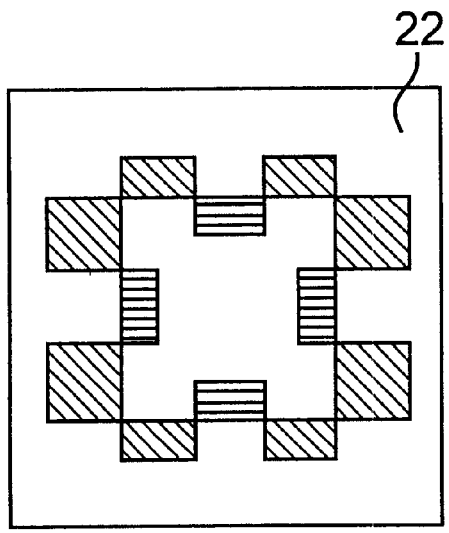

FIGS. 14(a)–14(c) depict this situation. FIG. 14(a) depicts an actual exemplary pattern element F7 situated inside a region 22. Item 23 is the corresponding element actually to be transferred to the substrate. The pattern element F7 is divided into a relatively large core portion as shown in FIG. 14(b) and secondary portions as shown in FIG. 14(c). In FIG. 14(b) the core portion consists of five parts 24–28, wherein part 24 has a profile substantially the same as the element 23 to be transferred to the substrate, and parts 25–28 are corners.

In FIG. 14(c) secondary portions with diagonal cross-hatching are situated inside the pattern element F7 but outside the core portion. The secondary portions with horizontal-line shading are not situated inside the pattern element F7 but are situated inside the core portion. As used herein, secondary portions located within the core portion but outside the actual element 23 are referred to as having a "negative" shape, i.e., having a negative area and thus making a negative contribution to cumulative exposure dose for the region 22.

After dividing the pattern element in this manner, the contribution to cumulative exposure dose is calculated individually for each of the core parts 24–28 shown in FIG. 14(b). In practice, the profile of the core portion usually is simple, and the core portion usually consists of relatively few parts. As a result, calculating the contribution of the core parts to cumulative exposure dose of the selected evaluation point is relatively simple and can be performed using known methods. On the other hand, the contributions to cumulative exposure dose for the secondary portions shown in FIG. 14(c) are calculated using a branching-structure determination according to the invention. When performing the calculation, secondary portions having a negative shape make negative contributions to centroid, area, and cumulative exposure dose. In any event, the individual contributions of the core portion and secondary portions to cumulative exposure dose are summed to yield the cumulative dose of exposure energy for the region.

The pattern-element profile of FIG. 14(a) is simplified for explanation purposes. Typically, in actual practice, the number of core portions is relatively small, and the number of secondary portions is very large. Hence, the advantages of employing a method, according to the invention, for making a branching division of a region are substantial.

The methods described above for calculating the cumulative dose of exposure energy for a region can be incorporated into a program executed by a computer, stored on a recording medium such as a CD, optical disk, ROM, etc., and suitably used when configuring the pattern on a reticle, mask, or the like.

Whereas, in the foregoing, embodiments are explained in the context of calculating a cumulative dose of exposure energy, it will be understood that calculating a proximity effect obtained using a CPB microlithography apparatus also is a type of cumulative-exposure-dose calculation that can benefit using methods according to the invention. I.e., in the respective flowcharts of the various embodiments described herein, the term "cumulative exposure dose" (cumulative dose of exposure energy) can be replaced with "cumulative exposure dose due to proximity effects." If a proximity effect at a point on a sensitive substrate, such as a wafer, is determined, then it is possible to determine a required altered shape of a reticle or mask, and to alter the shape of the reticle or mask, respectively, according to the determination.

Eighth Representative Embodiment

Figure 15:
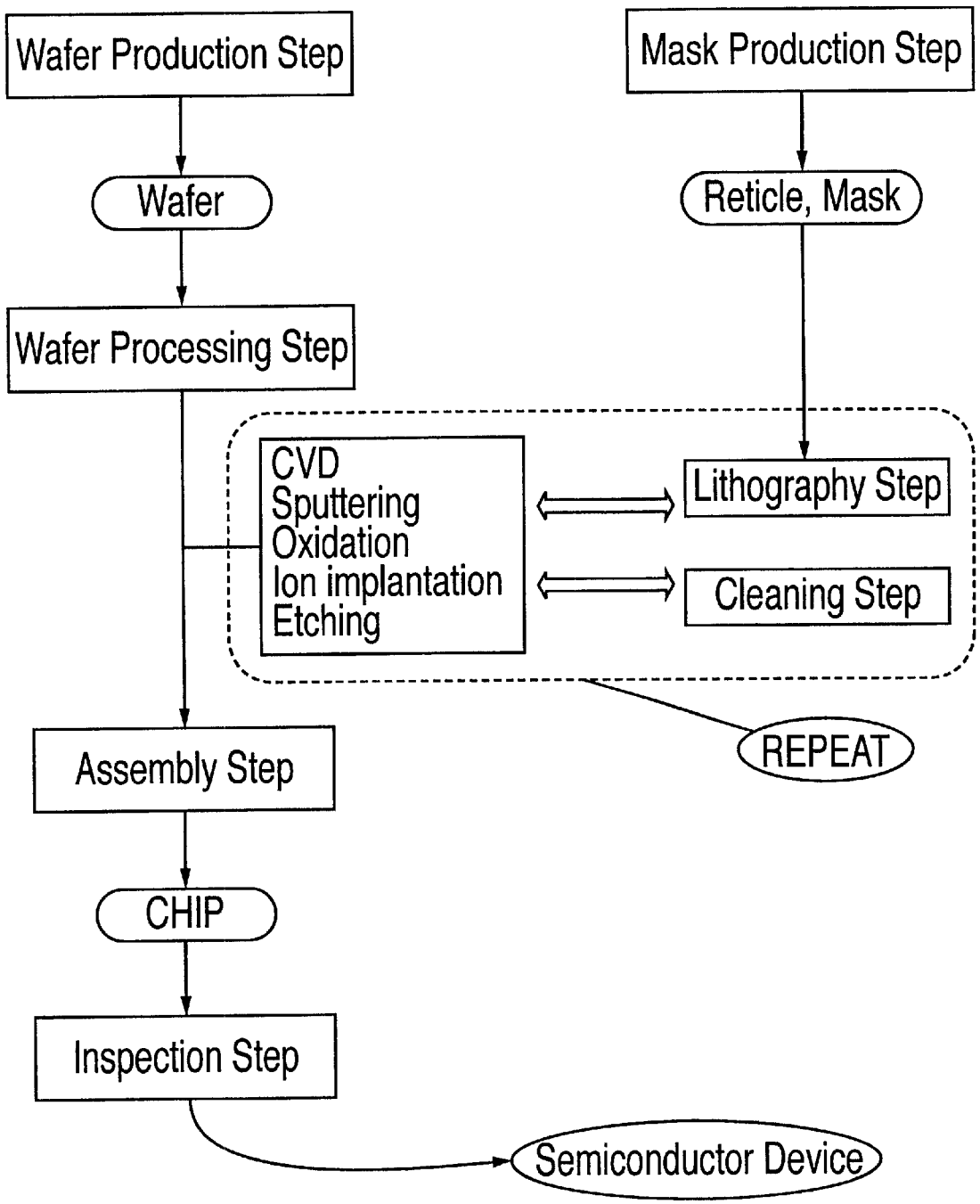
FIG. 15 is a process flowchart for manufacturing a microelectronic device, wherein the process includes a microlithography method according to the invention, as discussed in the eighth representative embodiment.
Figure 16:
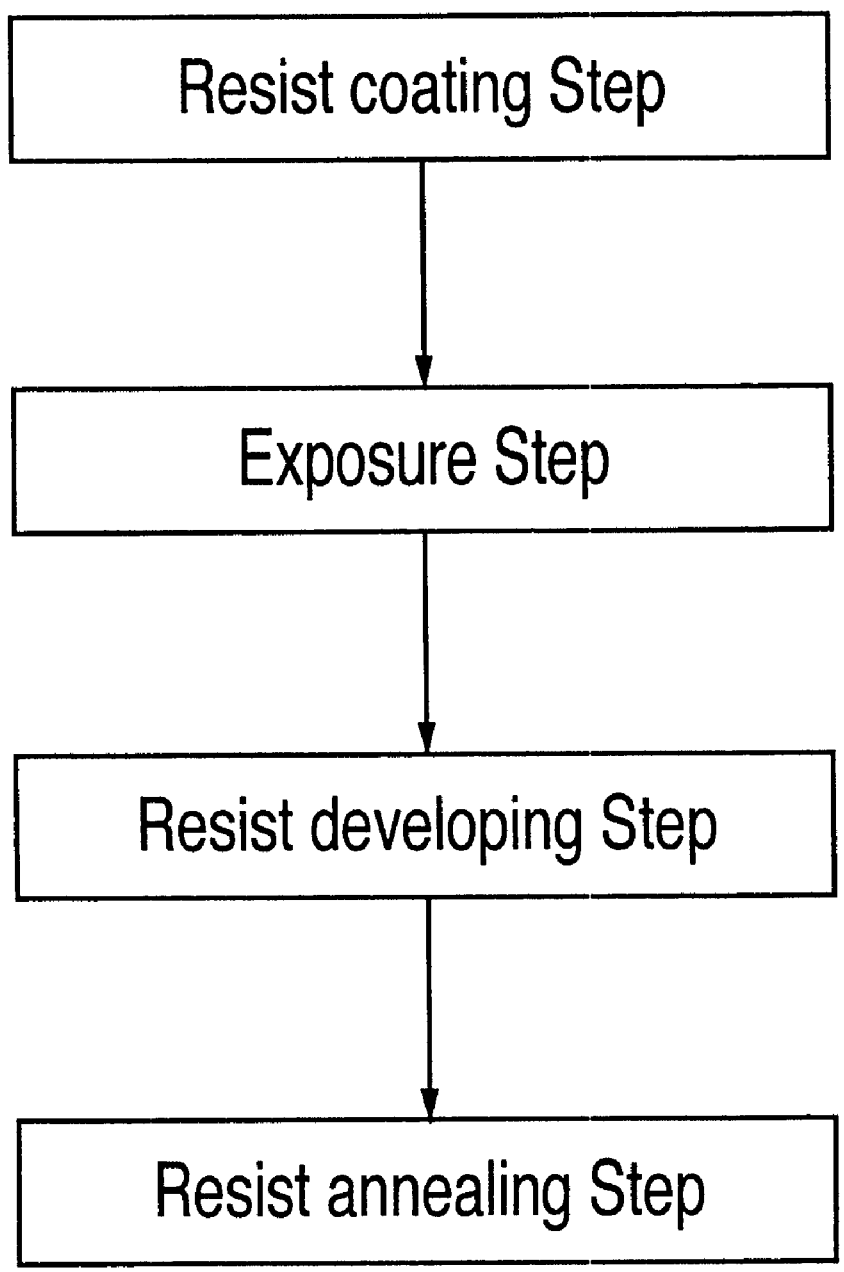
FIG. 16 is a process flowchart for performing the microlithography method referred to in FIG. 15.

FIG. 15 is a flowchart of an exemplary microelectronic-device fabrication method to which methods according to the invention readily can be applied. The fabrication method comprises the main steps of wafer production (wafer preparation); reticle production (reticle preparation); wafer processing; device assembly, dicing, and making the devices operational; and device inspection. Each step usually comprises several sub-steps.

Among these main steps, wafer processing is key to achieving the smallest feature sizes (critical dimensions), best inter-layer registration, and performance of the microelectronic devices. In the wafer-processing step, multiple circuit patterns are layered successively atop one another on the wafer, wherein the formation of each layer typically involves multiple sub-steps. Usually, many operative microelectronic devices (e.g., microprocessor chips or memory chips) are produced on each wafer.

Typical wafer-processing steps include: (1) thin-film formation (by, e.g., CVD or sputtering) involving formation of a dielectric layer for electrical insulation or a metal layer for interconnections; (2) oxidation to oxidize the thin film or the surface of the wafer itself; (3) microlithography to form a resist pattern (as defined by a reticle) on the wafer for selective processing of the thin film or the substrate itself; (4) etching (e.g., dry etching) or analogous step to etch the thin film or wafer according to the resist pattern; (5) doping or impurity implantation to implant ions or impurities into the thin film or wafer; (6) resist stripping to remove the resist from the wafer; and (7) chip inspection. Wafer processing is repeated as required (typically many times) to fabricate the desired microelectronic devices on the wafer.

FIG. 5 provides a flowchart of typical steps involved in microlithography, which is a principal step in wafer processing. The microlithography step typically includes: (1) a resist-coating step, wherein a suitable resist is coated on the wafer surface (which can include as circuit pattern formed in a previous wafer-processing step); (2) an exposure step, to expose the resist with the desired pattern and form a latent image of the pattern in the resist; (3) a development step, to develop the latent image in the exposed resist; and (4) an optional annealing step, to enhance the durability of the developed resist pattern.

These wafer-production steps, reticle-production steps, wafer-processing steps, and microlithography steps are well known. Hence, additional description of these steps is unnecessary. In any event, the microlithography step employs a reticle or mask that is configured accurately and quickly using a method according to the invention. An important result is the manufacture of microelectronic devices having fine patterns that can be fabricated quickly and with high yield.

EXAMPLE

Figure 17:
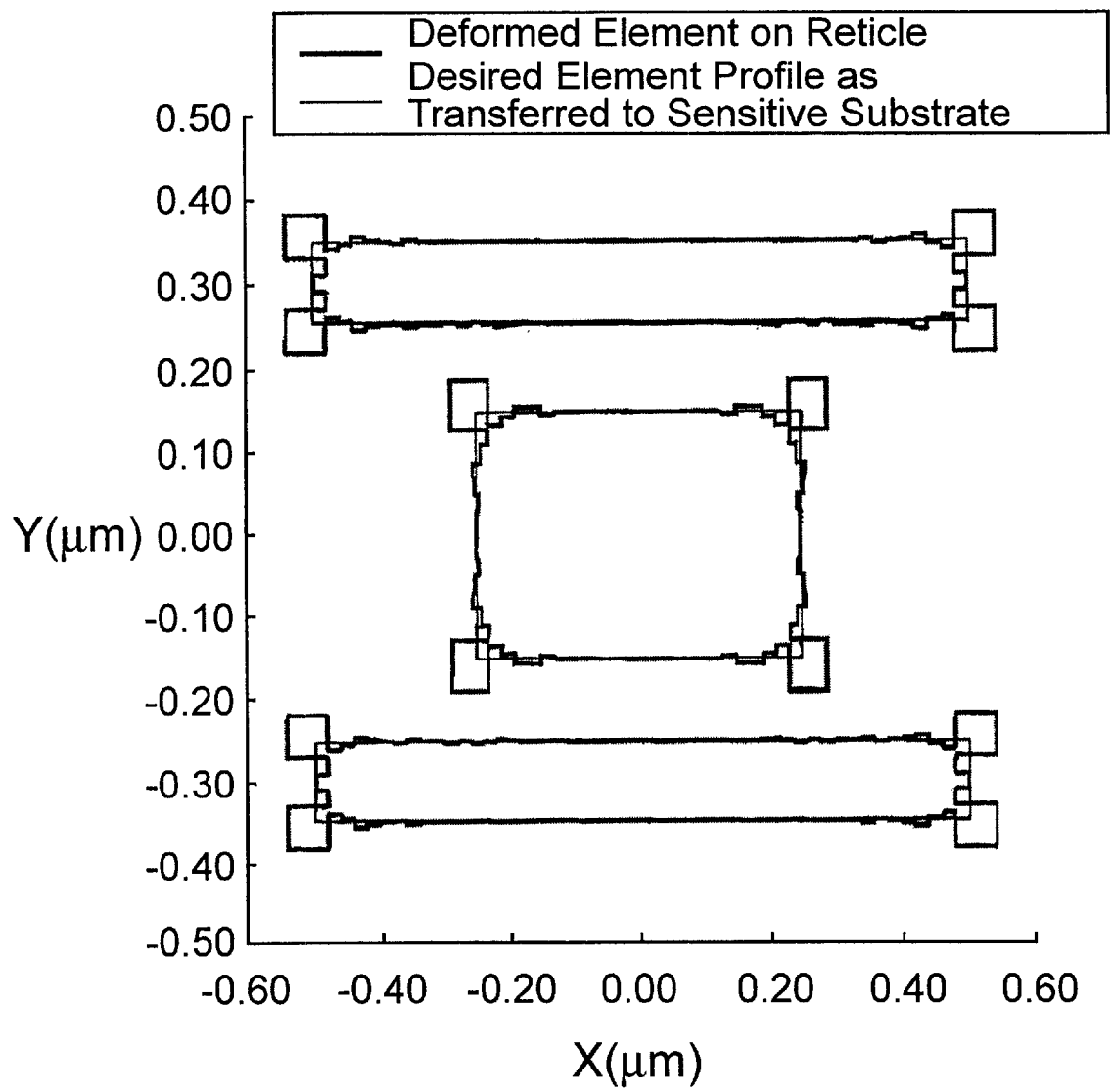
FIG. 17 depicts a layout of pattern elements within a subregion discussed in the Example.

Referring to FIG. 17, a cumulative dose of exposure energy was calculated for pattern elements in a region measuring 120 μm×100 μm, using the method described in the first representative embodiment (FIG. 5). Specifically, cumulative-exposure-dose calculations were performed for each of multiple evaluation points in pattern elements to be transferred to the sensitive substrate. Cumulative-exposure-dose calculations for corner portions of the elements (e.g., portions corresponding to parts 25–28 in FIG. 14) were calculated separately from respective core portions of the elements. The method of the first representative embodiment was applied to the remaining parts of the pattern elements. In performing the calculations, the value of φ was 1. For each pattern element, the respective representative figure was a single point situated at the centroid of the respective pattern element. Whenever a region of the reticle contained only a single pattern element, the contribution to cumulative exposure dose from that region was calculated directly without converting the element to a representative figure.

Figure 20A:
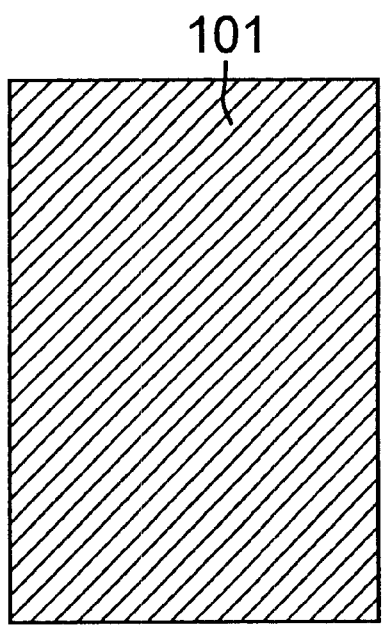
FIGS. 20(a)–20(c) depict a first conventional method for calculating cumulative exposure energy from a pattern element.
Figure 20B:
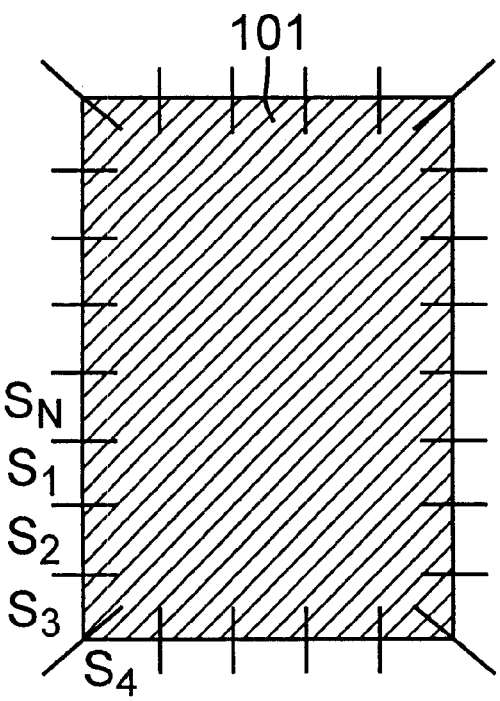
Figure 20C:
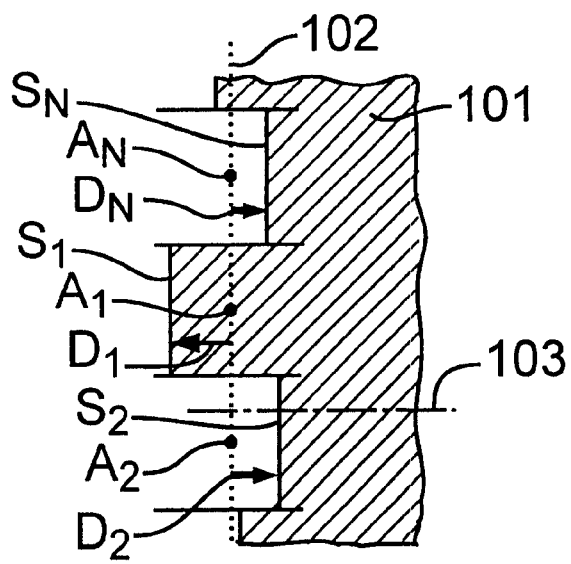
Figure 21A:
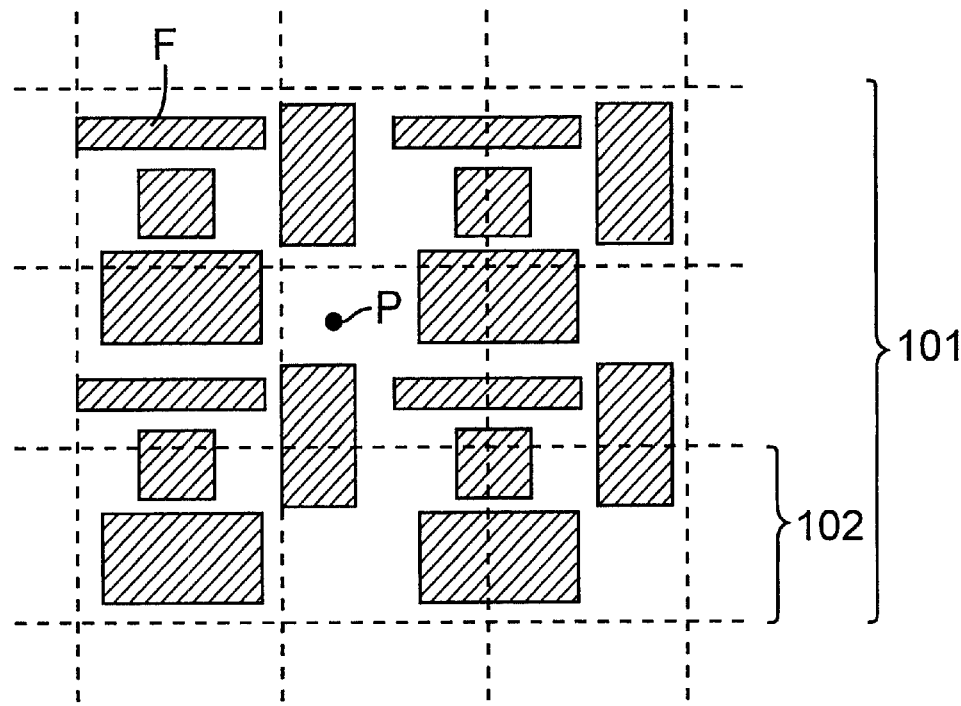
FIGS. 21(a)–21(b) depict a second conventional method for calculating cumulative exposure energy from multiple subregions of a pattern.
Figure 21B:
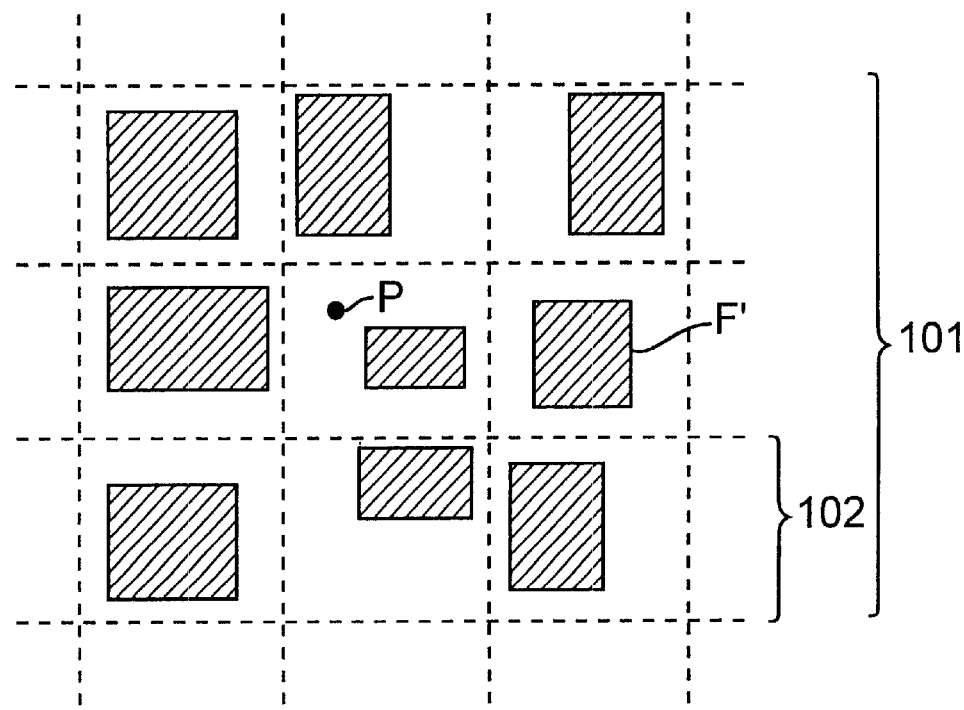

As a comparative example, the conventional method of calculating the effect of moving segments in the region, as shown in FIG. 20, was applied.

Figure 18:
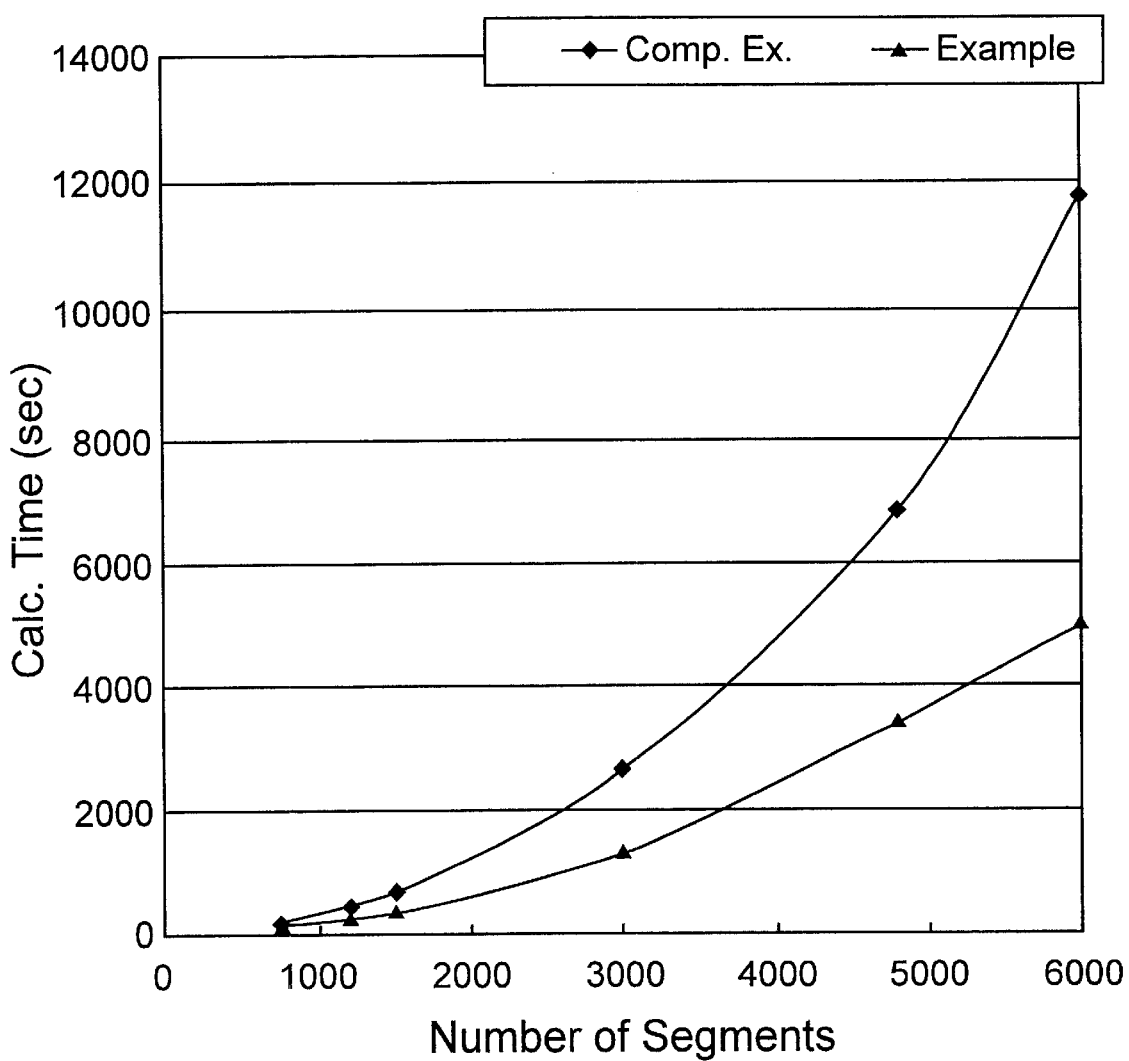
FIG. 18 provides respective plots of calculation times for the Example and comparative example.

FIG. 18 is a plot comparing respective calculation times for the example and comparative example, as a function of the number of segments referred to in the comparative example. In the comparative example, although high calculation accuracy is obtained, calculation time increases steeply with increased number of segments. In the example, in contrast, the calculation time is comparatively shorter (i.e., the "example" curve exhibits substantially less slope than corresponding regions of the "comparative example" curve) without degrading accuracy more than a significant extent.

Figure 19:
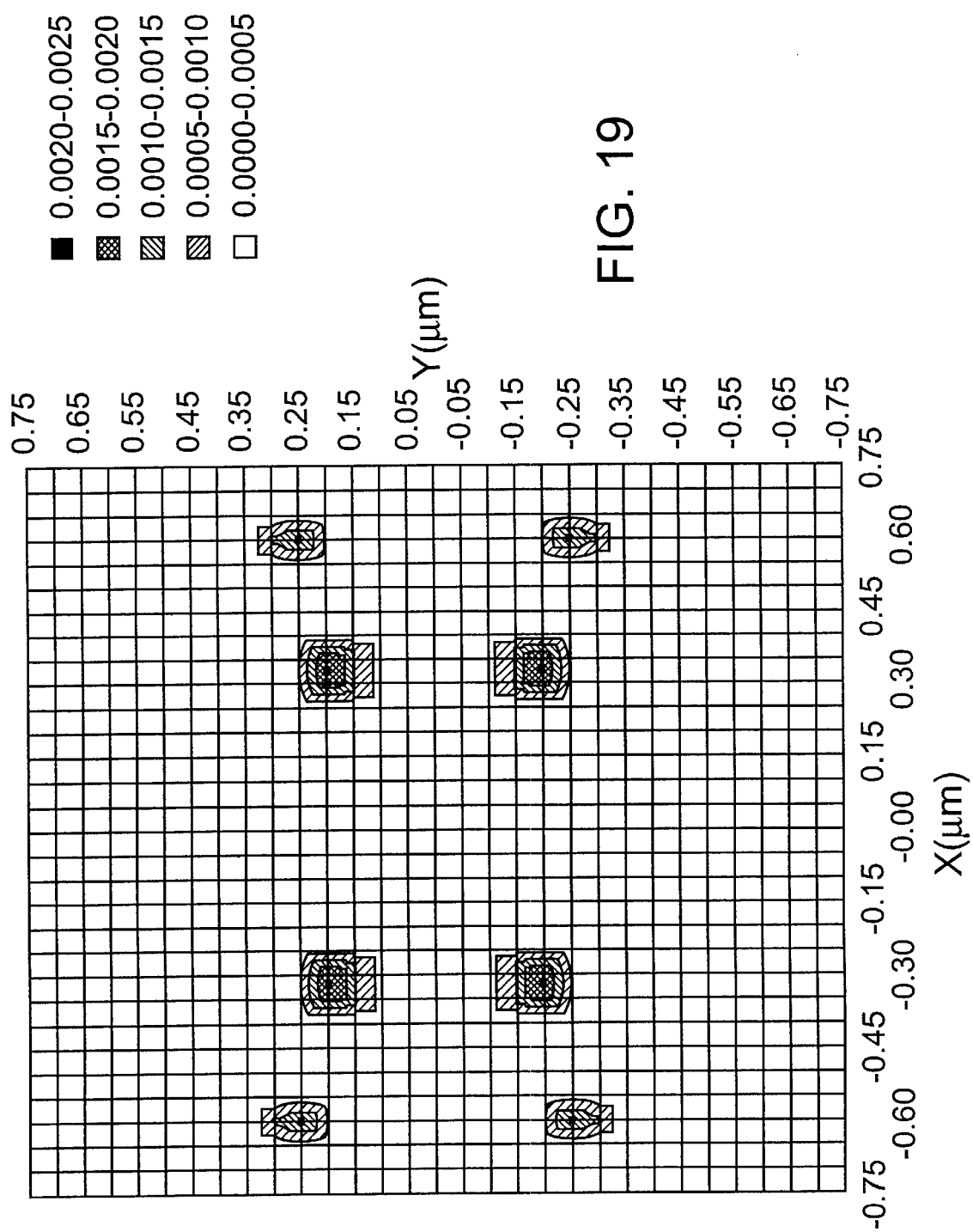
FIG. 19 depicts differences in calculation results for the Example and comparative example.

FIG. 19 depicts exemplary distributions of values of cumulative exposure dose accompanying various differences in cumulative exposure dose calculated according to the embodiment versus cumulative exposure dose calculated according to the comparative example. The area shown in FIG. 19 includes the center element shown in FIG. 17 as well as the respective adjacent longitudinal edges of the elements located above and below the center element (note similarity of coordinates between FIG. 19 and the corresponding region of FIG. 17). At each coordinate shown in FIG. 19, exposure dose is calculated by conventional method ($D_c$) and the method according to this example ($D_e$). The difference ($D_c-D_e$) is divided by a value of exposure dose ($D_m$, calculated according to the conventional method) that defines the pattern-element boundary on the sensitive substrate (i.e., the energy value serving as a threshold above which the resist can be developed and below which the resist cannot be developed). The result of this calculation, obtained at each coordinate shown in FIG. 19, is a "calculation error" which is a percentage difference in dose of the example method compared to the conventional method. In FIG. 19, the non-shaded regions are where the calculation error is 0.0000 to 0.0005 percent. The various shaded regions depict different percentage differences as indicated, and represent areas where proximity effects most likely would occur. As can be discerned from the figure, the difference between these two calculation methods is less than 1% of the energy value sufficient to create a pattern-element boundary in all regions of the substrate. (A difference of 0.002 to 0.0025 currently is deemed acceptable.) Hence, this embodiment provides a calculation accuracy, for practical purposes, that is essentially the same as realized using conventional methods, but the calculations performed according to the example were performed in substantially less time.

Whereas the invention has been described in connection with multiple representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. In a microlithography method in which a pattern defined on a reticle is transferred to a sensitive substrate using an energy beam, a method for determining a cumulative dose of exposure energy received by exposed portions of the sensitive substrate, the method comprising:

(a) in a first-level region of the reticle defining multiple pattern elements with respect to which cumulative exposure dose is to be determined, initializing a total cumulative dose for the region to zero, and selecting an evaluation point in the region at which cumulative exposure dose is to be calculated;

(b) dividing the region in a branching manner into a second level of subregions each having a respective reference point from which distance measurements concerning the subregion are to be taken;

(c) if a subregion has a size parameter that, in a ratio to a distance between the respective reference point and the evaluation point, is greater than a specified value φ, then (i) not subdividing the subregion, (ii) converting any pattern elements located in the subregion into at least one corresponding representative figure, (iii) based on the representative figure(s) in the subregion, calculating a contribution of the subregion to the cumulative exposure dose at the evaluation point, and (iv) adding the contribution to the total cumulative dose for the evaluation point in the region;

(d) if a subregion contains a number of pattern elements that is no greater than a specified number m, then (i) not subdividing the subregion, (ii) regarding the pattern element(s) in the subregion as its own respective representative figure, (iii) based on the representative figure(s) in the subregion, calculating a contribution of the subregion to cumulative exposure dose at the evaluation point, and (iv) adding the contribution to the total cumulative dose for the evaluation point in the region; and (e) if a subregion does not satisfy (c) or (d), then subdividing the subregion in a branching manner into a next-lower level of subregions, each next-lower-level subregion having a respective reference point from which distance measurements concerning the subregion are to be taken, and repeating steps (c) and (d) for each of the next-lower-level subregions; and (f) after exhaustively subdividing the region per steps (c)–(e), then regarding a resulting cumulative exposure dose as the cumulative exposure dose for the evaluation point in the region.

2. The method of claim 1, wherein step (c) is performed before step (d).

3. The method of claim 1, wherein step (c) is performed after step (d).

4. The method of claim 1, wherein, if a subregion contains a number of pattern elements that is no greater than the specified number m, then converting the pattern element(s) into a corresponding representative figure(s).

5. The method of claim 1, wherein calculating an energy contribution of a pattern element comprises the steps:

dividing the pattern element into a core portion and secondary portions, the core portion having a simpler profile than the pattern element, wherein one or more of the secondary portions can have a negative shape;

calculating a respective contribution of the core portion to cumulative exposure energy is performed separately from calculating respective contributions of the secondary portions to cumulative exposure energy;

calculating the respective contributions of the secondary portions is performed according to the method of claim 1; and the respective contribution of each pattern element is determined by summing the contribution of the respective core portion and the contributions of the respective secondary portions.

6. A computer-readable medium containing a computer program for performing the method of claim 1.

7. In a charged-particle-beam microlithography method in which a pattern defined on a reticle is transferred to a sensitive substrate by a charged particle beam, a method for determining a proximity effect, comprising:

(a) in a first-level region of the reticle defining multiple pattern elements with respect to which a cumulative exposure dose is to be determined, initializing a total cumulative dose for the region to zero, and selecting an evaluation point in the region at which cumulative exposure dose is to be calculated;

(b) dividing the region in a branching manner into a second level of subregions each having a respective reference point from which distance measurements concerning the subregion are to be taken;

(c) if a subregion has a size parameter that, in a ratio to a distance between the respective reference point and the evaluation point, is greater than a specified value $\phi$, then (i) not subdividing the subregion, (ii) converting any pattern elements located in the subregion into at least one corresponding representative figure, (iii) based on the representative figure(s) in the subregion, calculating a contribution of the subregion to the cumulative exposure dose at the evaluation point, and (iv) adding the contribution to the total cumulative dose for the evaluation point in the region;

(d) if a subregion contains a number of pattern elements that is no greater than a specified number m, then (i) not subdividing the subregion, (ii) regarding the pattern element(s) in the subregion as its own respective representative figure, (iii) based on the representative figure(s) in the subregion, calculating a contribution of the subregion to cumulative exposure dose at the evaluation point, and (iv) adding the contribution to the total cumulative dose for the evaluation point in the region; and (e) if a subregion does not satisfy (c) or (d), then subdividing the subregion in a branching manner into a next-lower level of subregions, each next-lower-level subregion having a respective reference point from which distance measurements concerning the subregion are to be taken, and repeating steps (c) and (d) for each of the next-lower-level subregions;

(f) after exhaustively subdividing the region per steps (c)–(e), then regarding a resulting cumulative exposure dose as the cumulative exposure dose for the evaluation point in the region; and (g) from the cumulative exposure dose, determining the respective proximity effect.

8. In a method for designing a reticle, a method for determining a proximity effect, comprising:

(a) in a first-level region of the reticle defining multiple pattern elements with respect to which a cumulative exposure dose is to be determined, initializing a total cumulative dose for the region to zero, and selecting an evaluation point in the region at which cumulative exposure dose is to be calculated;

(b) dividing the region in a branching manner into a second level of subregions each having a respective reference point from which distance measurements concerning the subregion are to be taken;

(c) if a subregion has a size parameter that, in a ratio to a distance between the respective reference point and the evaluation point, is greater than a specified value $\phi$, then (i) not subdividing the subregion, (ii) converting any pattern elements located in the subregion into at least one corresponding representative figure, (iii) based on the representative figure(s) in the subregion, calculating a contribution of the subregion to the cumulative exposure dose at the evaluation point, and (iv) adding the contribution to the total cumulative dose for the evaluation point in the region;

(d) if a subregion contains a number of pattern elements that is no greater than a specified number m, then (i) not subdividing the subregion, (ii) regarding the pattern element(s) in the subregion as its own respective representative figure, (iii) based on the representative figure(s) in the subregion, calculating a contribution of the subregion to cumulative exposure dose at the evaluation point, and (iv) adding the contribution to the total cumulative dose for the evaluation point in the region;

(e) if a subregion does not satisfy (c) or (d), then subdividing the subregion in a branching manner into a next-lower level of subregions, each next-lower-level subregion having a respective reference point from which distance measurements concerning the subregion are to be taken, and repeating steps (c) and (d) for each of the next-lower-level subregions;

(f) after exhaustively subdividing the region per steps (c)–(e), then regarding a resulting cumulative exposure dose as the cumulative exposure dose for the evaluation point in the region; and (g) from the cumulative exposure dose, determining the respective proximity effect.

9. The method of claim 8, wherein the reticle is designed with pattern elements configured to produce desired pattern-element profiles on the sensitive substrate notwithstanding respective proximity effects.

10. In a microlithography method in which a pattern defined on a reticle is transferred to a sensitive substrate using an energy beam, a method for determining a cumulative dose of exposure energy received by exposed portions of the sensitive substrate, the method comprising:

(a) in a first-level region of the reticle defining multiple pattern elements with respect to which cumulative exposure dose is to be determined, initializing a total cumulative dose for the region to zero, and selecting an evaluation point in the region at which cumulative exposure dose is to be calculated;

(b) dividing the region in a branching manner into one or more sublevels of subregions as required until each of the subregions thus formed contains a respective number of pattern elements no greater than a specified number m, thereby creating a branching structure of subregions from the first level to an $n^{th}$ level, each subregion having a respective reference point from which distance measurements concerning the respective subregion are to be taken;

(c) if a subregion in an $i^{th}$ ($1 \leq i \leq n$) level has a size parameter that, in a ratio to a distance between the respective reference point and the evaluation point, is greater than a specified value $\phi$, then (i) converting any pattern elements located in the subject subregion into at least one corresponding representative figure, (ii) based on the representative figure(s) in the subject subregion, calculating a contribution of the subject subregion to the cumulative exposure dose at the evaluation point, (iii) without regard to any contributions possibly made by $(i+1)^{th}$ or other lower-level subregions of the subject subregion, adding the contribution of the subject subregion to the total cumulative dose for the evaluation point in the region;

(d) if the subregion in the $i^{th}$ level contains a number of pattern elements that is no greater than a specified number m, then (i) regarding the pattern element(s) in the subject subregion as its own respective representative figure(s), (ii) based on the representative figure(s) in the subject subregion, calculating a contribution of the subject subregion to the cumulative exposure dose at the evaluation point, and (iii) adding the contribution of the subject subregion to the cumulative dose for the evaluation point in the region;

(e) if a subregion does not satisfy (c) or (d), then repeating steps (c) and (d) for $(i+1)^{th}$-level subregions of the subject subregion; and (f) after performing steps (c)–(e) for all applicable subregions of the region, then regarding a resulting cumulative exposure dose as the cumulative exposure dose for the evaluation point in the region.

11. The method of claim 10, wherein step (c) is performed before step (d).

12. The method of claim 10, wherein step (c) is performed after step (d).

13. The method of claim 10, wherein, if a subregion contains a number of pattern elements that is no greater than the specified number m, then converting the pattern element(s) into a corresponding representative figure(s).

14. The method of claim 10, wherein calculating an energy contribution of a pattern element comprises the steps:

dividing the pattern element into a core portion and secondary portions, the core portion having a simpler profile than the pattern element, wherein one or more of the secondary portions can have a negative shape;

calculating a respective contribution of the core portion to cumulative exposure energy is performed separately from calculating respective contributions of the secondary portions to cumulative exposure energy;

calculating the respective contributions of the secondary portions is performed according to the method of claim 10; and the respective contribution of each pattern element is determined by summing the contribution of the respective core portion and the contributions of the respective secondary portions.

15. A computer-readable medium containing a computer program for performing the method of claim 10.

16. In a charged-particle-beam microlithography method in which a pattern defined on a reticle is transferred to a sensitive substrate by a charged particle beam, a method for determining a proximity effect, comprising:

(a) in a first-level region of the reticle defining multiple pattern elements with respect to which a cumulative exposure dose is to be determined, initializing a total cumulative dose for the region to zero, and selecting an evaluation point in the region at which cumulative exposure dose is to be calculated;

(b) dividing the region in a branching manner into one or more sublevels of subregions as required until each of the subregions thus formed contains a respective number of pattern elements no greater than a specified number m, thereby creating a branching structure of subregions from the first level to an $n^{th}$ level, each subregion having a respective reference point from which distance measurements concerning the respective subregion are to be taken;

(c) if a subregion in an $i^{th}$ ($1 \leq i \leq n$) level has a size parameter that, in a ratio to a distance between the respective reference point and the evaluation point, is greater than a specified value $\phi$, then (i) converting any pattern elements located in the subject subregion into at least one corresponding representative figure, (ii) based on the representative figure(s) in the subject subregion, calculating a contribution of the subject subregion to the cumulative exposure dose at the evaluation point, (iii) without regard to any contributions possibly made by $(i+1)^{th}$ or other lower-level subregions of the subject subregion, adding the contribution of the subject subregion to the total cumulative dose for the evaluation point in the region;

(d) if the subregion in the $i^{th}$ level contains a number of pattern elements that is no greater than a specified number m, then (i) regarding the pattern element(s) in the subject subregion as its own respective representative figure(s), (ii) based on the representative figure(s) in the subject subregion, calculating a contribution of the subject subregion to the cumulative exposure dose at the evaluation point, and (iii) adding the contribution of the subject subregion to the cumulative dose for the evaluation point in the region;

(e) if a subregion does not satisfy (c) or (d), then repeating steps (c) and (d) for $(i+1)^{th}$-level subregions of the subject subregion;

(f) after performing steps (c)–(e) for all applicable subregions of the region, then regarding a resulting cumulative exposure dose as the cumulative exposure dose for the evaluation point in the region; and (g) from the cumulative exposure dose, determining the respective proximity effect.

17. In a method for designing a reticle, a method for determining a proximity effect, comprising:

(a) in a first-level region of the reticle defiling multiple pattern elements with respect to which a cumulative exposure dose is to be determined, initializing a total cumulative dose for the region to zero, and selecting an evaluation point in the region at which cumulative exposure dose is to be calculated;

(b) dividing the region in a branching manner into one or more sublevels of subregions as required until each of the subregions thus formed contains a respective number of pattern elements no greater than a specified number m, thereby creating a branching structure of subregions from the first level to an $n^{th}$ level, each subregion having a respective reference point from which distance measurements concerning the respective subregion ale to be taken;

(c) if a subregion in an $i^{th}$ ($1 \leq i \leq n$) level has a size parameter that, in a ratio to a distance between the respective reference point and the evaluation point, is greater than a specified value $\phi$, then (i) converting any pattern elements located in the subject subregion into at least one corresponding representative figure, (ii) based on the representative figure(s) in the subject subregion, calculating a contribution of the subject subregion to the cumulative exposure dose at the evaluation point, (iii) without regard to any contributions possibly made by $(i+1)^{th}$ or other lower-level subregions of the subject subregion, adding the contribution of the subject subregion to the total cumulative dose for the evaluation point in the region;

(d) if the subregion in the $i^{th}$ level contains a number of pattern elements that is no greater than a specified number m, then (i) regarding the pattern element(s) in the subject subregion as its own respective representative figure(s), (ii) based on the representative figure(s) in the subject subregion, calculating a contribution of the subject subregion to the cumulative exposure dose at the evaluation point, and (iii) adding the contribution of the subject subregion to the cumulative dose for the evaluation point in the region;

(e) if a subregion does not satisfy (c) or (d), then repeating steps (c) and (d) for $(i+1)^{th}$-level subregions of the subject subregion;

(f) after performing steps (c)–(e) for all applicable subregions of the region, then regarding a resulting cumulative exposure dose as the cumulative exposure dose for the evaluation point in the region; and (g) from the cumulative exposure dose, determining the respective proximity effect.

18. The method of claim 17, wherein the reticle is designed with pattern elements configured to produce desired pattern-element profiles on the sensitive substrate notwithstanding respective proximity effects.

19. In a microlithography method in which a pattern defined on a reticle is transferred to a sensitive substrate using an energy beam, a method for determining a cumulative dose of exposure energy received by exposed portions of the sensitive substrate, the method comprising:

(a) selecting a region of the reticle defining multiple pattern elements with respect to which cumulative exposure dose is to be determined, and selecting an evaluation point in the region at which cumulative exposure dose is to be calculated;

(b) dividing the region in a branching manner into one or more sublevels of subregions, each subregion having a respective reference point from which distance measurements concerning the respective subregion are to be taken;

(c) if a subregion has a size parameter that, in a ratio to a distance between the respective reference point and the evaluation point, is greater than a specified value $\phi$, then (i) not subdividing the subject subregion, and (ii) converting any pattern elements located in the subject subregion into at least one corresponding representative figure;

(d) if the subregion contains a number of pattern elements that is no greater than a specified number m, then (i) not subdividing the subregion, and (ii) regarding the pattern element(s) in the subregion as its own respective representative figure;

(e) if the subregion does not satisfy (c) or (d), then subdividing the subject subregion in a branching manner into a next-lower level of subregions, each next-lower-level subregion having a respective reference point from which distance measurements concerning the subregion are to be taken, and repeating steps (c) and (d) for each of the next-lower-level subregions; and (f) after exhaustively subdividing the region per steps (c)–(e), then calculating respective contributions of exposure energy from each of the subregions to a cumulative exposure dose for the region, and regarding the resulting cumulative exposure dose as the cumulative exposure dose for the evaluation point in the region.

20. The method of claim 19, wherein step (c) is performed before step (d).

21. The method of claim 19, wherein step (c) is performed after step (d).

22. The method of claim 19, wherein, if a subregion contains a number of pattern elements that is no greater than the specified number m, then converting the pattern element(s) into a corresponding representative figure(s).

23. The method of claim 19, wherein calculating an energy contribution of a pattern element comprises the steps:

dividing the pattern element into a core portion and secondary portions, the core portion having a simpler profile than the pattern element, wherein the secondary portions can have a negative shape;

calculating a respective contribution of the core portion to cumulative exposure energy is performed separately from calculating respective contributions of the secondary portions to cumulative exposure energy;

calculating the respective contributions of the secondary portions is performed according to the method of claim 19; and the respective contribution of each pattern element is determined by summing the contribution of the respective core portion and the contributions of the respective secondary portions.

24. A computer-readable medium containing a computer program for performing the method of claim 19.

25. In a charged-particle-beam microlithography method in which a pattern defined on a reticle is transferred to a sensitive substrate by a charged particle beam, a method for determining a proximity effect:

(a) selecting a region of the reticle defining multiple pattern elements with respect to which a cumulative exposure dose is to be determined, and selecting an evaluation point in the region at which cumulative exposure dose is to be calculated;

(b) dividing the region in a branching manner into one or more sublevels of subregions, each subregion having a respective reference point from which distance measurements concerning the respective subregion are to be taken;

(c) if a subregion has a size parameter that, in a ratio to a distance between the respective reference point and the evaluation point, is greater than a specified value $\phi$, then (i) not subdividing the subject subregion, and (ii) converting any pattern elements located in the subject subregion into at least one corresponding representative figure;

(d) if the subregion contains a number of pattern elements that is no greater than a specified number m, then (i) not subdividing the subregion, and (ii) regarding the pattern element(s) in the subregion as its own respective representative figure;

(e) if the subregion does not satisfy (c) or (d), then subdividing the subject subregion in a branching manner into a next-lower level of subregions, each next-lower-level subregion having a respective reference point from which distance measurements concerning the subregion are to be taken, and repeating steps (c) and (d) for each of the next-lower-level subregions;

(f) after exhaustively subdividing the region per steps (c)–(e), then calculating respective contributions of exposure energy from each of the subregions to a cumulative exposure dose for the region, and regarding the resulting cumulative exposure dose as the cumulative exposure dose for the evaluation point in the region; and (g) from the cumulative exposure dose, determining the respective proximity effect.

26. In a method for designing a reticle, a method for determining a proximity effect, comprising:

(a) selecting a region of the reticle defining multiple pattern elements with respect to which a cumulative exposure dose is to be determined, and selecting an evaluation point in the region at which cumulative exposure dose is to be calculated;

(b) dividing the region in a branching manner into one or more sublevels of subregions, each subregion having a respective reference point from which distance measurements concerning the respective subregion are to be taken;

(c) if a subregion has a size parameter that, in a ratio to a distance between the respective reference point and the evaluation point, is greater than a specified value $\phi$, then (i) not subdividing the subject subregion, and (ii) converting any pattern elements located in the subject subregion into at least one corresponding representative figure;

(d) if the subregion contains a number of pattern elements that is no greater than a specified number m, then (i) not subdividing the subregion, and (ii) regarding the pattern element(s) in the subregion as its own respective representative figure;

(e) if the subregion does not satisfy (c) or (d), then subdividing the subject subregion in a branching manner into a next-lower level of subregions, each next-lower-level subregion having a respective reference point from which distance measurements concerning the subregion are to be taken, and repeating steps (c) and (d) for each of the next-lower-level subregions;

(f) after exhaustively subdividing the region per steps (c)–(e), then calculating respective contributions of exposure energy each of the subregions to a cumulative exposure dose for the region, and regarding the resulting cumulative exposure dose as the cumulative exposure dose for the evaluation point in the region; and (g) from the cumulative exposure dose, determining the respective proximity effect.

27. The method of claim 26, wherein the reticle is designed with pattern elements configured to produce desired pattern-element profiles on the sensitive substrate notwithstanding respective proximity effects.

28. In a microlithography method in which a pattern defined on a reticle is transferred to a sensitive substrate using an energy beam, a method for determining a cumulative dose of exposure energy received by exposed portions of the sensitive substrate, the method comprising:

(a) in a first-level region of the reticle defining multiple pattern elements with respect to which cumulative exposure dose is to be determined, selecting an evaluation point in the region at which cumulative exposure dose is to be calculated;

(b) dividing the region in a branching manner into one or more sublevels of subregions as required until each of the subregions thus formed contains a respective number of pattern elements no greater than a specified number m, thereby creating a branching structure of subregions from the first level to an $n^{th}$ level, each subregion having a respective reference point from which distance measurements concerning the respective subregion are to be taken;

(c) if a subregion in an $i^{th}$ ($1 \leq i \leq n$) level has a size parameter that, in a ratio to a distance between the respective reference point and the evaluation point, is greater than a specified value $\phi$, then converting any pattern elements located in the subject subregion into at least one corresponding representative figure, but not creating respective representative figures for pattern elements located in any lower-level subdivisions of the subject subregion;

(d) if the subregion contains a number of pattern elements that is no greater than a specified number m, then regarding the pattern element(s) in the subregion as its own respective representative figure, and not creating respective representative figures for pattern elements located in any lower-level subdivisions of the subject subregion;

(e) if the subject subregion does not satisfy either (c) or (d), then creating respective representative figures for respective pattern elements contained in $(i+1)^{th}$-level subregions of the subject subregion; and (f) with respect to all subregions of the subject region from the first level to the $n^{th}$ level, summing the individual exposure-dose contributions from the representative figures in the subregions to yield a cumulative exposure dose for the evaluation point in the region.

29. The method of claim 28, wherein step (c) is performed before step (d).

30. The method of claim 28, wherein step (c) is performed after step (d).

31. The method of claim 28, wherein, if a subregion contains a number of pattern elements that is no greater than the specified number m, then converting the pattern element(s) into a corresponding representative figure(s).

32. The method of claim 28, wherein calculating an energy contribution of a pattern element comprises the steps:

dividing the pattern element into a core portion and secondary portions, the core portion having a simpler profile than the pattern element, wherein one or more of the secondary portions can have a negative shape;

calculating a respective contribution of the core portion to cumulative exposure energy is performed separately from calculating respective contributions of the secondary portions to cumulative exposure energy;

calculating the respective contributions of the secondary portions is performed according to the method of claim 28; and the respective contribution of each pattern element is determined by summing the contribution of the respective core portion and the contributions of the respective secondary portions.

33. A computer-readable medium containing a computer program for performing the method of claim 28.

34. In a charged-particle-beam microlithography method in which a pattern defined on a reticle is transferred to a sensitive substrate by a charged particle beam, a method for determining a proximity effect, comprising:

(a) in a first-level region of the reticle defining multiple pattern elements with respect to which a cumulative exposure dose is to be determined, selecting an evaluation point in the region at which cumulative exposure dose is to be calculated;

(b) dividing the region in a branching manner into one or more sublevels of subregions as required until each of the subregions thus formed contains a respective number of pattern elements no greater than a specified number m, thereby creating a branching structure of subregions from the first level to an $n^{th}$ level, each subregion heaving a respective reference point from which distance measurements concerning the respective subregion are to be taken;

(c) if a subregion in an $i^{th}$ ($1 \leq i \leq n$) level has a size parameter that, in a ratio to a distance between the respective reference point and the evaluation point, is greater than a specified value $\phi$, then converting any pattern elements located in the subject subregion into at least one corresponding representative figure, but not creating respective representative figures for pattern elements located in any lower-level subdivisions of the subject subregion;

(d) if the subregion contain a number of pattern elements that is no greater than a specified number m, then regarding the pattern element(s) in the subregion as its own respective representative figure, and not creating respective representative figures for pattern elements located in any lower-level subdivisions of the subject subregion;

(e) if the subject subregion does not satisfy either (c) or (d), then creating respective representative figures for respective pattern elements contained in $(i+1)^{th}$-level subregions of the subject subregion;

(f) with respect to all subregions of the subject region from the first level to the $n^{th}$ level, summing the individual exposure-dose contributions from the representative figures in the subregions to yield a cumulative exposure dose for the evaluation point in the region; and (g) from the cumulative exposure dose, determining the respective proximity effect.

35. In a method for designing a reticle, a method for determining a proximity effect, comprising:

(a) in a first-level region of the reticle defining multiple pattern elements with respect to which a cumulative exposure dose is to be determined, selecting an evaluation point in the region at which cumulative exposure dose is to be calculated;

(b) dividing the region in a branching manner into one or more sublevels of subregions as required until each of the subregions thus formed contains a respective number of pattern elements no greater than a specified number m, thereby creating a branching structure of subregions from the first level to an $n^{th}$ level, each subregion having a respective reference point from which distance measurements concerning the respective subregion are to be taken;

(c) if a subregion in an $i^{th}$ ($1 \leq i \leq n$) level has a size parameter that, in a ratio to a distance between the respective reference point and the evaluation point, is greater than a specified value $\phi$, then converting any pattern elements located in the subject subregion into at least one corresponding representative figure, but not creating respective representative figures for pattern elements located in any lower-level subdivisions of the subject subregion;

(d) if the subregion contains a number of pattern elements that is no greater than a specified number m, then regarding the pattern element(s) in the subregion as its own respective representative figure, and not creating respective representative figures for pattern elements located in any lower-level subdivisions of the subject subregion;

(e) if the subject subregion does not satisfy either (c) or (d), then creating respective representative figures for respective pattern elements contained in $(i+1)^{th}$-level subregions of the subject subregion;

(f) with respect to all subregions of the subject region from the first level to the $n^{th}$ level, sunning the individual exposure-dose contributions from the representative figures in the subregions to yield a cumulative exposure dose for the evaluation point in the region; and (g) from the cumulative exposure dose, determining the respective proximity effect.

36. The method of claim 35, wherein the reticle is designed with pattern elements configured to produce desired pattern-element profiles on the sensitive substrate notwithstanding respective proximity effects.

37. In a microlithography method in which a pattern defined on a reticle is transferred to a sensitive substrate using an energy beam, a method for determining a cumulative dose of exposure energy received by exposed portions of the sensitive substrate, the method comprising:

(a) in a first-level region of the reticle defining multiple pattern elements with respect to which cumulative exposure dose is to be determined, selecting an evaluation point in the region at which cumulative exposure dose is to be calculated;

(b) dividing the region in a branching manner into one or more sublevels of subregions as required until each of the subregions thus formed contains a respective number of pattern elements no greater than a specified number m, thereby creating a branching structure of subregions from the first level to an $n^{th}$ level, each subregion having a respective reference point from which distance measurements concerning the respective subregion are to be taken;

(c) for each subregion formed in step (b), if the subject subregion contains a number of pattern elements that is no greater than a specified number m, then regarding the pattern element(s) in the subject subregion as its own respective representative figure(s), and if the subject subregion contains a number of pattern elements that is greater than the specified number m, then converting the pattern elements located in the subject subregion into at least one corresponding representative figure;

(d) for each subregion formed in step (b), if the subject subregion has a size parameter that, in a ratio to a distance between the respective reference point and the evaluation point, is greater than a specified value $\phi$, then calculating a contribution of the subject subregion to the cumulative exposure dose without considering any contribution of lower-level subregions of the subject subregion to the cumulative exposure dose;

(e) for each subregion formed in step (b), if the subject subregion contains a number of pattern elements that is no greater than the specified number m, then calculating a contribution of the respective representative figure(s) to the cumulative exposure dose without considering any contribution of lower-level subregions of the subject subregion to the cumulative exposure dose;

(f) if a subregion does not satisfy (d) or (e), then including in the calculation of the respective contribution of the subject subregion to cumulative exposure dose any contribution of lower-level subregions of the subject subregion;

(g) summing the individual calculated exposure-dose contributions from all the subregions of steps (d)–(f) to yield a cumulative exposure dose for the evaluation point in the region.

38. The method of claim 37, wherein step (d) is performed before step (e).

39. The method of claim 37, wherein step (d) is performed after step (e).

40. The method of claim 37, wherein, if a subregion contains a number of pattern elements that is no greater than the specified number m, then converting the pattern element(s) into a corresponding representative figure(s).

41. The method of claim 37, wherein calculating an energy contribution of a pattern element comprises the steps:

dividing the pattern element into a core portion and secondary portions, the core portion having a simpler profile than the pattern element, wherein the secondary portions can have a negative shape;

calculating a respective contribution of the core portion to cumulative exposure energy is performed separately from calculating respective contributions of the secondary portions to cumulative exposure energy;

calculating the respective contributions of the secondary portions is performed according to the method of claim 37; and the respective contribution of each pattern element is determined by summing the contribution of the respective core portion and the contributions of the respective secondary portions.

42. A computer-readable medium containing a computer program for performing the method of claim 37.

43. In a charged-particle-beam microlithography method in which a pattern defined on a reticle is transferred to a sensitive substrate by a charged particle beam, a method for determining a proximity effect, comprising:

(a) in a first-level region of the reticle defining multiple pattern elements with respect to which a cumulative exposure dose is to be determined, selecting an evaluation point in the region at which cumulative exposure dose is to be calculated;

(b) dividing the region in a branching manner into one or more sublevels of subregions as required until each of the subregions thus formed contains a respective number of pattern elements no greater than a specified number m, thereby creating a branching structure of subregions from the first level to an $n^{th}$ level, each subregion having a respective reference point from which distance measurements concerning the respective subregion are to be taken;

(c) for each subregion formed in step (b), if the subject subregion contains a number of pattern elements that is no greater than a specified number m, then regarding the pattern element(s) in the subject subregion as its own respective representative figure(s), and if the subject subregion contains a number of pattern elements that is greater than the specified number m, then converting the pattern elements located in the subject subregion into at least one corresponding representative figure;

(d) for each subregion formed in step (b), if the subject subregion has a size parameter that, in a ratio to a distance between the respective reference point and the evaluation point, is greater than a specified value $\phi$, then calculating a contribution of the subject subregion to the cumulative exposure dose without considering any contribution of lower-level subregions of the subject subregion to the cumulative exposure dose;

(e) for each subregion formed in step (b), if the subject subregion contains a number of pattern elements that is no greater than the specified number m, then calculating a contribution of the respective representative figure(s) to the cumulative exposure dose without considering any contribution of lower-level subregions of the subject subregion to the cumulative exposure dose;

(f) if a subregion does not satisfy (d) or (e), then including in the calculation of the respective contribution of the subject subregion to cumulative exposure dose any contribution of lower-level subregions of the subject subregion;

(g) summing the individual calculated exposure-dose contributions from all the subregions of steps (d)–(f) to yield a cumulative exposure dose for the evaluation point in the region; and (h) from the cumulative exposure dose, determining the respective proximity effect.

44. In a method for designing a reticle, a method for determining a proximity effect, comprising:

(a) in a first-level region of the reticle defining multiple pattern elements with respect to which a cumulative exposure dose is to be determined, selecting an evaluation point in the region at which cumulative exposure dose is to be calculated;

(b) dividing the region in a branching manner into one or more sublevels of subregions as required until each of the subregions thus formed contains a respective number of pattern elements no greater than a specified number m, thereby creating a branching structure of subregions from the first level to an $n^{th}$ level, each subregion having a respective reference point from which distance measurements concerning the respective subregion are to be taken;

(c) for each subregion formed in step (b), if the subject subregion contains a number of pattern elements that is no greater than a specified number m, then regarding the pattern element(s) in the subject subregion as its own respective representative figure(s), and if the subject subregion contains a number of pattern elements that is greater than the specified number m, then converting the pattern elements located in the subject subregion into at least one corresponding representative figure;

(d) for each subregion formed in step (b), if the subject subregion has a size parameter that, in a ratio to a distance between the respective reference point and the evaluation point, is greater than a specified value $\phi$, then calculating a contribution of the subject subregion to the cumulative exposure dose without considering any contribution of lower-level subregions of the subject subregion to the cumulative exposure dose;

(e) for each subregion formed in step (b), if the subject subregion contains a number of pattern elements that is no greater than the specified number m, then calculating a contribution of the respective representative figure(s) to the cumulative exposure dose without considering any contribution of lower-level subregions of the subject subregion to the cumulative exposure dose;

(f) if a subregion does not satisfy (d) or (e), then including in the calculation of the respective contribution of the subject subregion to cumulative exposure dose any contribution of lower-level subregions of the subject subregion;

(g) summing the individual calculated exposure-dose contributions from all the subregions of steps (d)–(f) to yield a cumulative exposure dose for the evaluation point in the region; and (h) from the cumulative exposure dose, determining the respective proximity effect.

45. The method of claim 44, wherein the reticle is designed with pattern elements configured to produce desired pattern-element profiles on the sensitive substrate notwithstanding respective proximity effects.

46. A method for fabricating a microelectronic device, comprising:

designing a reticle according to claim 8;

preparing a wafer;

processing the wafer, including performing a microlithography step to transfer a pattern, defined by the reticle, to the wafer; and assembling devices formed on the wafer.

47. A method for fabricating a microelectronic device, comprising:

designing a reticle according to claim 17;

preparing a wafer;

processing the wafer, including performing a microlithography step to transfer a pattern, defined by the reticle, to the wafer; and assembling devices formed on the wafer.

48. A method for fabricating a microelectronic device, comprising:

designing a reticle according to claim 26;

preparing a wafer;

processing the wafer, including performing a microlithography step to transfer a pattern, defined by the reticle, to the wafer; and assembling devices formed on the wafer.

49. A method for fabricating a microelectronic device, comprising:

designing a reticle according to claim 35;

preparing a wafer;

processing the wafer, including performing a microlithography step to transfer a pattern, defined by the reticle, to the wafer; and assembling devices formed on the wafer.

50. A method for fabricating a microelectronic device, comprising:

designing a reticle according to claim 44;

preparing a wafer;

processing the wafer, including performing a microlithography step to transfer a pattern, defined by the reticle, to the wafer; and assembling devices formed on the wafer.

* * * * *

UNITED STATES PATENT AND TRADEMARK OFFICE
CERTIFICATE OF CORRECTION

PATENT NO.    : 6,501,083 B1
DATED         : December 31, 2002
INVENTOR(S)   : Kamijo It is certified that error appears in the above-identified patent and that said Letters Patent is hereby corrected as shown below:

Column 15,
Line 43, "If D/L $\leq \varnothing$," should be -- If D/L $> \varnothing$, --.

Column 29,
Line 9, "defiling" should be -- defining --.
Line 22, "ale" should be -- are --.

Column 32,
Line 5, "energy each" should be -- energy from each --.

Column 33,
Line 36, "heaving" should be -- having --.

Column 34,
Line 38, "sunning" should be -- summing --.

Signed and Sealed this

Twenty-third Day of December, 2003

JAMES E. ROGAN
*Director of the United States Patent and Trademark Office*